(12) United States Patent
Shiozaki et al.

(10) Patent No.: US 10,790,582 B2
(45) Date of Patent: Sep. 29, 2020

(54) ANTENNA DEVICE

(71) Applicant: Panasonic Intellectual Property Management Co., Ltd., Osaka (JP)

(72) Inventors: Ryosuke Shiozaki, Tokyo (JP); Ken Takahashi, Ishikawa (JP); Tomohiro Yui, Kanagawa (JP); Noriaki Saito, Tokyo (JP); Kouji Suzuki, Kanagawa (JP); Yuichi Kashino, Ishikawa (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 7 days.

(21) Appl. No.: 16/198,910

(22) Filed: Nov. 23, 2018

(65) Prior Publication Data

US 2019/0165462 A1 May 30, 2019

(30) Foreign Application Priority Data

Nov. 27, 2017 (JP) .................................. 2017-226998

(51) Int. Cl.
*H01Q 1/42* (2006.01)
*H01Q 19/06* (2006.01)
(Continued)

(52) U.S. Cl.
CPC ............ *H01Q 1/42* (2013.01); *G01S 13/931* (2013.01); *H01Q 1/12* (2013.01); *H01Q 1/325* (2013.01);
(Continued)

(58) Field of Classification Search
CPC ............ H01Q 1/12; H01Q 1/325; H01Q 1/42; H01Q 9/0407; H01Q 17/00; H01Q 19/062; H01Q 19/10
See application file for complete search history.

(56) References Cited

U.S. PATENT DOCUMENTS

| | | | |
|---|---|---|---|
| 5,227,800 A | 7/1993 | Huguenin et al. | |
| 6,014,108 A * | 1/2000 | Lynch | H01Q 1/3233 342/175 |

(Continued)

FOREIGN PATENT DOCUMENTS

| | | |
|---|---|---|
| EP | 1462817 A1 | 9/2004 |
| JP | 2009-103457 | 5/2009 |

OTHER PUBLICATIONS

The Extended European Search Report dated Apr. 8, 2019 for the related European Patent Application No. 18207927.7.
(Continued)

*Primary Examiner* — Hoang V Nguyen
(74) *Attorney, Agent, or Firm* — Seed IP Law Group LLP

(57) ABSTRACT

An antenna device that has a housing formed with a window surface and transmits and receives an electromagnetic wave through a cover member facing the window surface, the antenna device having a length in a direction of transmitting and receiving the electromagnetic wave that is greater than a height thereof, comprises: a circuit board that is provided inside the housing; a reflection plate that is provided inside the housing and faces a board surface of the circuit board; a transmitting antenna that is provided inside the housing and transmits the electromagnetic wave to a side of the reflection plate; and a receiving antenna that is provided inside the housing and receives the electromagnetic wave.

20 Claims, 18 Drawing Sheets

(51) Int. Cl.

| | | |
|---|---|---|
| *H01Q 15/08* | (2006.01) | |
| *H01Q 21/06* | (2006.01) | |
| *G01S 13/931* | (2020.01) | |
| *H01Q 1/32* | (2006.01) | |
| *H01Q 15/14* | (2006.01) | |
| *H01Q 1/12* | (2006.01) | |
| *H01Q 9/04* | (2006.01) | |
| *H01Q 17/00* | (2006.01) | |
| *H01Q 19/10* | (2006.01) | |
| *H05K 1/02* | (2006.01) | |
| *H05K 1/18* | (2006.01) | |
| *G01S 7/02* | (2006.01) | |

(52) U.S. Cl.
CPC ......... *H01Q 1/3233* (2013.01); *H01Q 1/3283* (2013.01); *H01Q 9/0407* (2013.01); *H01Q 15/08* (2013.01); *H01Q 15/14* (2013.01); *H01Q 17/00* (2013.01); *H01Q 19/062* (2013.01); *H01Q 19/10* (2013.01); *H01Q 21/065* (2013.01); *H05K 1/0243* (2013.01); *H05K 1/181* (2013.01); *G01S 2007/027* (2013.01); *H05K 2201/10098* (2013.01)

(56) References Cited

U.S. PATENT DOCUMENTS

| | | |
|---|---|---|
| 6,034,642 A | 3/2000 | Kojima et al. |
| 2002/0067314 A1 | 6/2002 | Takimoto et al. |
| 2009/0140911 A1 | 6/2009 | Kato et al. |
| 2011/0279304 A1 | 11/2011 | Yonemoto et al. |
| 2013/0229299 A1 | 9/2013 | Matsuzawa et al. |

OTHER PUBLICATIONS

The Extended European Search Report dated Apr. 8, 2019 for the related European Patent Application No. 18207926.9.

* cited by examiner

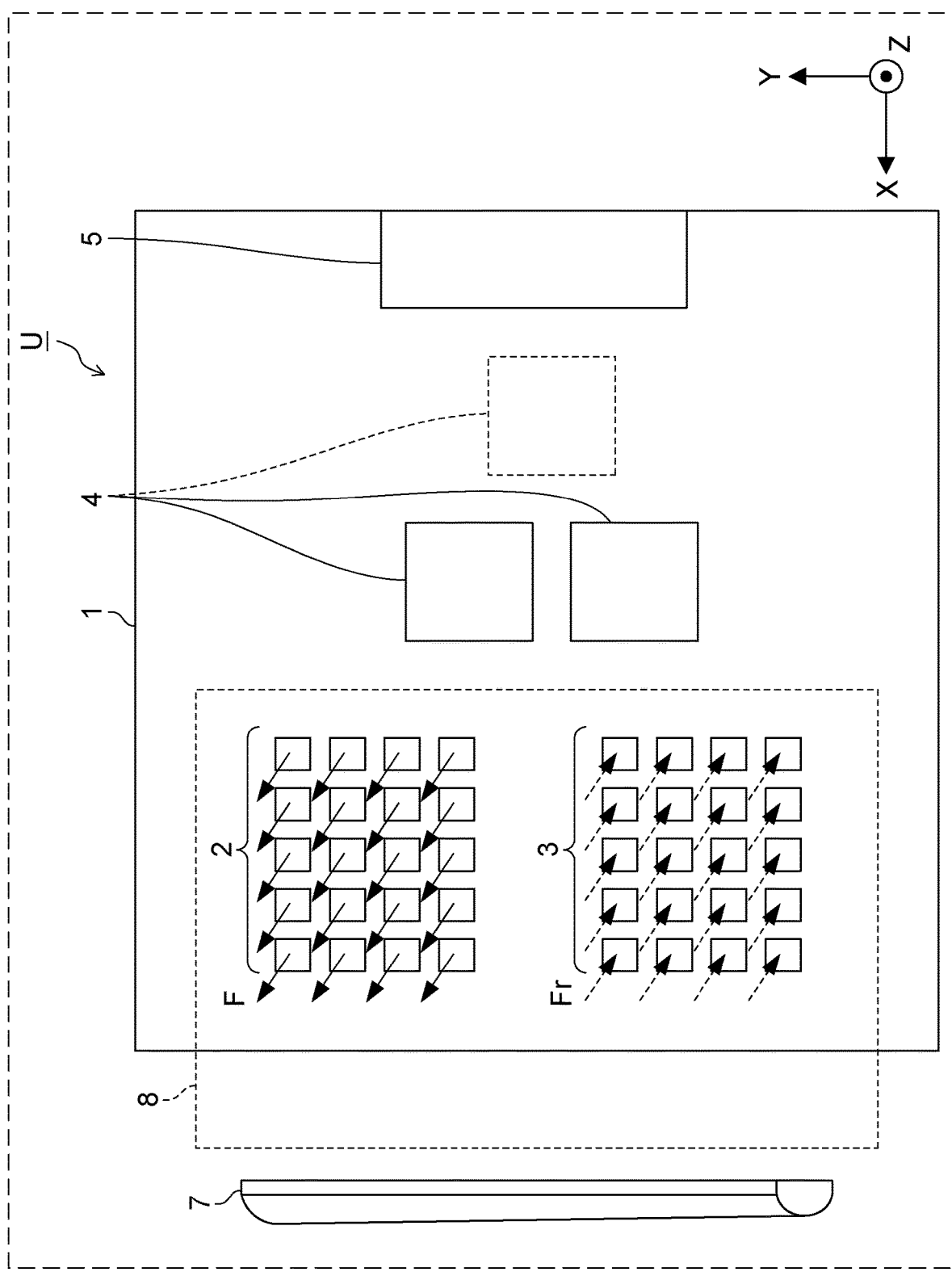

US 10,790,582 B2

ANTENNA DEVICE

BACKGROUND

1. Technical Field

The present disclosure relates to an antenna device.

2. Description of the Related Art

An antenna device has been known, which is for a radar using electromagnetic waves in a frequency band of millimeter-waves and microwaves to detect a position of an object (hereinafter also referred to as "target") without contact.

The antenna device is, for example, mounted in a vehicle and used for monitoring multiple directions including a front direction, front-side directions, and rear-side directions. In terms of protecting a vehicle device from a flying object outside the vehicle device and keeping the exterior of the vehicle body, such an antenna device is mounted inside of a cover member of a vehicle such as a bumper and is configured to transmit and receive electromagnetic waves through that cover member.

Electromagnetic waves with a high frequency such as the millimeter-waves generally have a property of passing through an insulator (e.g., resin material forming bumper); however, transmission of that electromagnetic waves varies depending on conditions such as a permittivity of the insulator, a thickness of the insulator, and an incident angle on the insulator. Thus, a part of the electromagnetic waves transmitted by the antenna device is reflected by an inner wall of the cover member, and this causes noise when that antenna device is detecting an object. In particular, those reflected waves from that cover member may cause multiple reflection between the cover member and a board on which an antenna of the antenna device is disposed (described later with reference to FIG. 3).

Japanese Patent Application Publication No. 2009-103457 discloses that, for example, the multiple reflection between the cover member and the antenna surface facing the cover member is inhibited by inclining the antenna surface so as to deviate from the antenna surface propagation directions of the reflected waves from the cover member.

SUMMARY

However, since the conventional technique according to Japanese Unexamined Patent Application Publication No. 2009-103457 presupposes that the antenna surface on the board is disposed to face the cover member, it is impossible to avoid the reflected waves from the cover member arriving at the antenna surface depending on the shape of that cover member, and accuracy of object detection thus can be insufficient. In addition, since in the conventional technique according to Japanese Unexamined Patent Application Publication No. 2009-103457, directions of the transmitted electromagnetic waves are restricted by the shape of the cover member, it is impossible to efficiently transmit the electromagnetic waves to desirable directions.

On the other hand, in a general antenna device, output gain sometimes decreases because multiple reflection between the antenna device and the cover (bumper) member causes phases to cancel out each other.

One non-limiting and exemplary embodiment is in light of the above problems and provides an antenna device that is preferable for transmitting and receiving electromagnetic waves through a cover member.

In one general aspect, the techniques disclosed here feature an antenna device that has a housing formed with a window surface and transmits and receives an electromagnetic wave through a cover member facing the window surface, the antenna device having a length in a direction of transmitting and receiving the electromagnetic wave that is greater than a height thereof, comprising: a circuit board that is provided inside the housing; a reflection plate that is provided inside the housing and faces a board surface of the circuit board; a transmitting antenna that is provided inside the housing and transmits the electromagnetic wave to a side of the reflection plate; and a receiving antenna that is provided inside the housing and receives the electromagnetic wave.

An antenna device according to the present disclosure is more preferable to be used for transmitting and receiving electromagnetic waves through a cover member.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 5 is a plan view of the antenna device according to the first embodiment;

DETAILED DESCRIPTION

Embodiments of the present disclosure are described below in detail with reference to accompanied drawings. In this description and the drawings, duplicated descriptions of constituents having substantially the same functions are omitted by denoting the same reference signs.

In order to clarify positional relationships between the constituents, a common Cartesian coordinate system (X, Y, Z) based on a front direction in which an antenna device transmits electromagnetic waves to outside the device (i.e., a direction as a target of object detection) is indicated throughout the drawings. Hereinafter, descriptions are given using an X-axis positive direction representing the front direction in which the antenna device transmits the electromagnetic waves to outside the device (hereinafter abbreviated as "front direction"), a Y-axis positive direction representing a right side surface direction of the antenna device, and a Z-axis positive direction representing an upward direction of the antenna device (hereinafter abbreviated as "upward direction").

(Underlying Knowledge Forming Basis of the Present Disclosure)

First, an effect of the electromagnetic waves reflected by a cover member on a detection performance of the antenna device is described with reference to FIGS. 1 to 3. Hereinafter, a vehicle-mounted radar device is described as an example.

Figure 1:
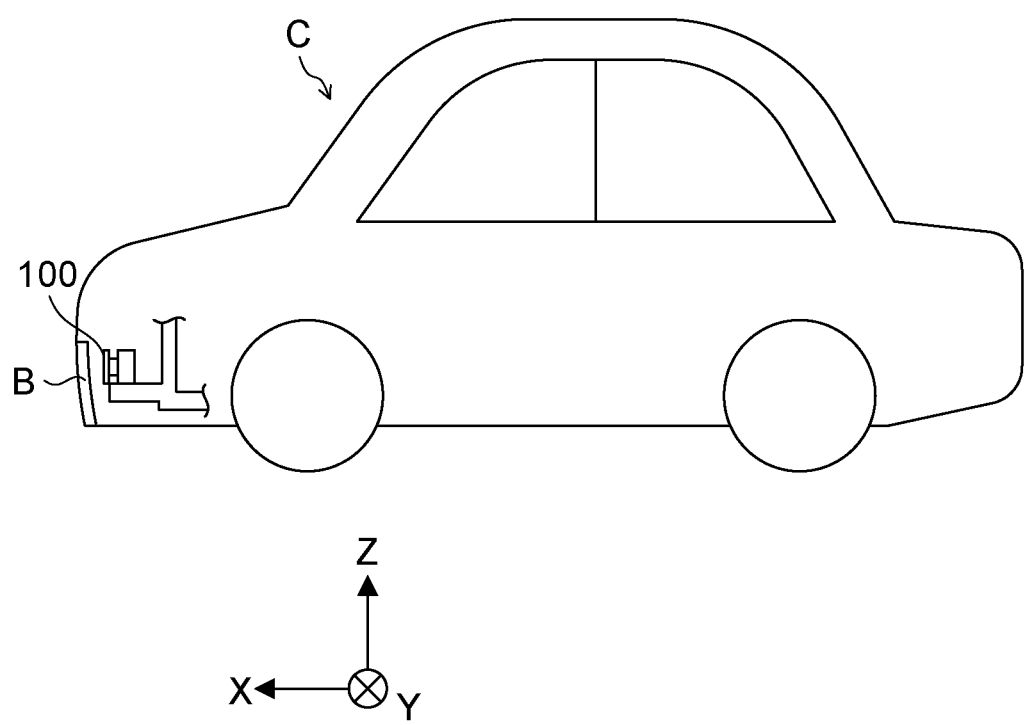
FIG. 1 is a diagram that illustrates an example of a state where an antenna device according to a conventional technique is mounted.

FIG. 1 is a diagram that illustrates an example of a state where an antenna device 100 according to a conventional technique is mounted. FIG. 1 illustrates an aspect where the antenna device 100 according to the conventional technique is mounted in a cover member B of a vehicle C (here, a bumper member of the vehicle C). In FIG. 1, the Z-axis positive direction corresponds to an upward direction of the vehicle C (direction perpendicular to ground) while the X-axis positive direction corresponds to a traveling direction of the vehicle C (direction horizontal to ground).

Figure 2:
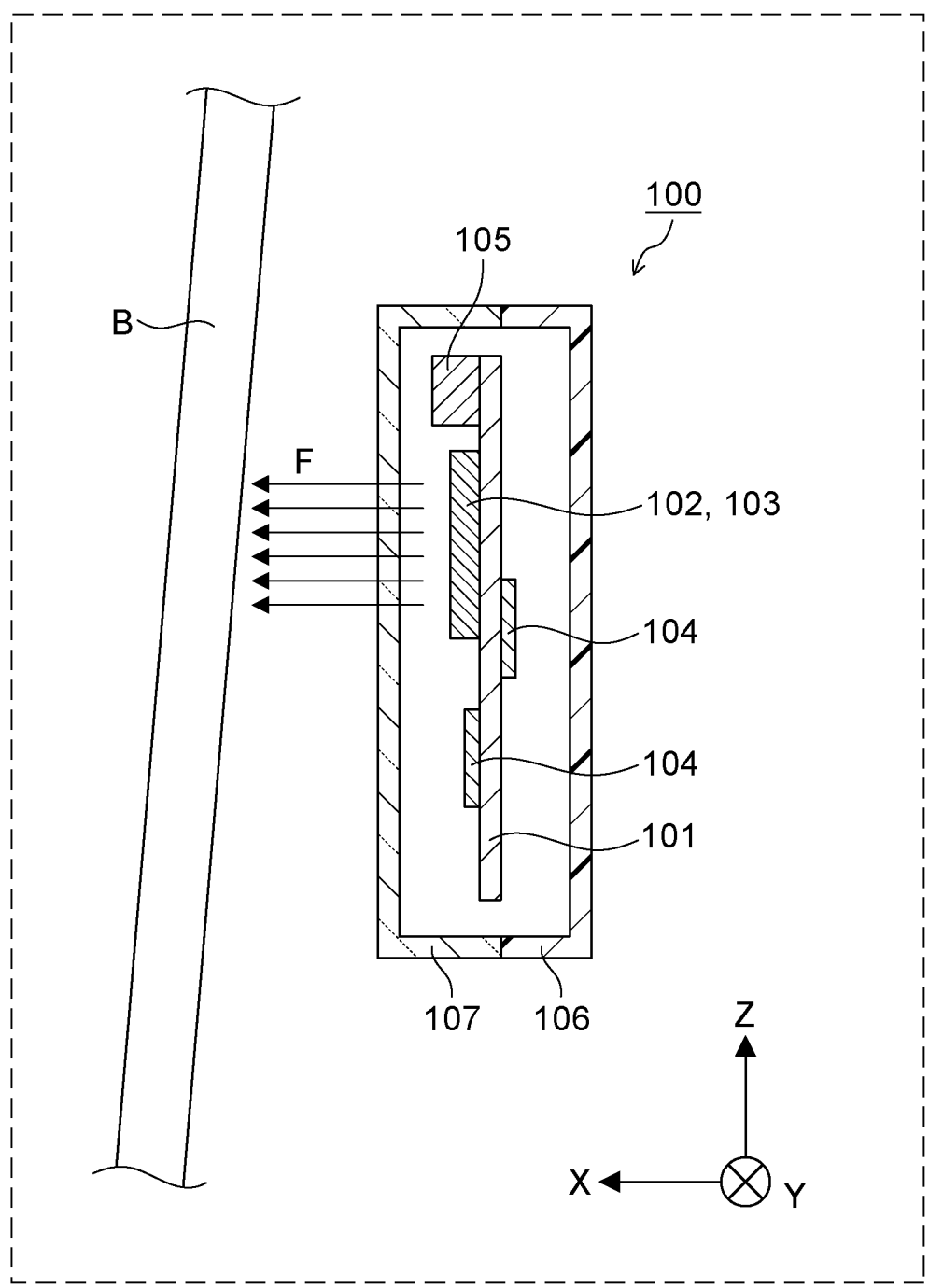
FIG. 2 is a side cross-sectional view of the antenna device according to the conventional technique.

FIG. 2 is a side cross-sectional view of the antenna device 100 according to the conventional technique.

The antenna device 100 according to the conventional technique includes, for example, a circuit board 101, a transmitting antenna 102, a receiving antenna 103, signal processing ICs 104, a connector 105, a housing 106, and a radome 107.

A board surface of the circuit board 101 is mounted with the transmitting antenna 102, the receiving antenna 103, the signal processing ICs 104, and the connector 105.

In general, a patch antenna and the like that transmits and receives electromagnetic waves in a normal direction of the board surface of the circuit board 101 is used as the transmitting antenna 102 and the receiving antenna 103.

The circuit board 101 is disposed such that the board surface on which the transmitting antenna 102 and receiving antenna 103 are disposed is directed toward the front direction side of the vehicle C so that the board surface faces the cover member B. In this way, directivity directions of the transmitting antenna 102 and receiving antenna 103 is directed toward the front direction side of the antenna device 100. Solid arrows F in FIG. 2 represent the electromagnetic waves transmitted by the transmitting antenna 102.

The circuit board 101 is stored in the housing 106, and the transmitting antenna 102 and receiving antenna 103 respectively transmits and receives the electromagnetic waves to and from outside the antenna device 100 through the radome 107 supported at a front surface of that housing 106.

With such a configuration, the antenna device 100 according to the conventional technique transmits and receives the electromagnetic waves through the cover member B (e.g., bumper member) to specify a position of a target outside the antenna device 100. As illustrated in FIG. 2, the bumper member of the vehicle C usually has a shape extending in a direction vertical to the ground.

Figure 3:
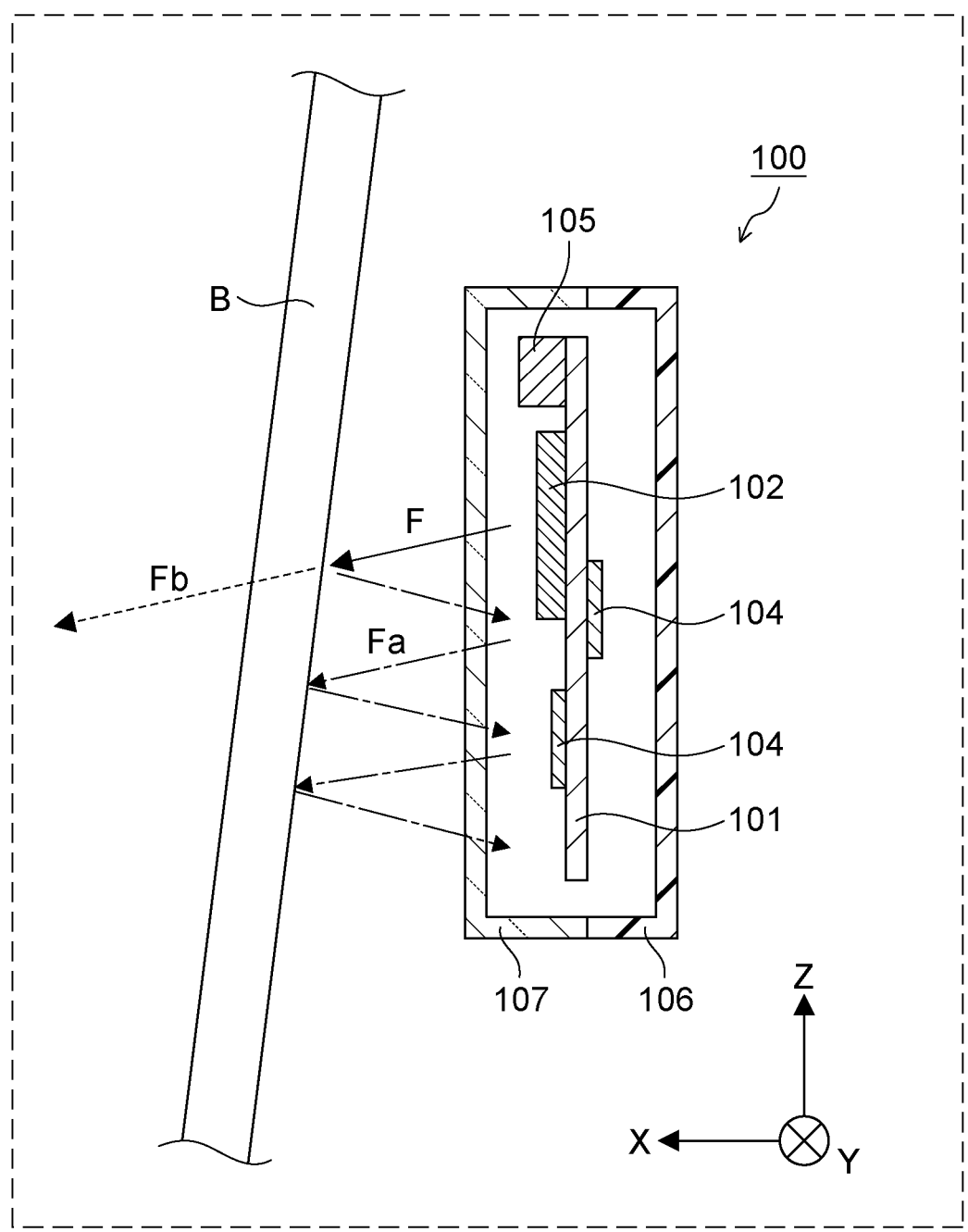
FIG. 3 is a diagram that illustrates behavior of an electromagnetic wave when the antenna device according to the conventional technique is in operation.

FIG. 3 is a diagram that illustrates behavior of the electromagnetic wave when the antenna device 100 according to the conventional technique is in operation. FIG. 3 illustrates an aspect where the antenna device 100 transmits and receives the electromagnetic wave in a direction horizontal to the ground to allow the electromagnetic wave to pass through the cover member B.

The solid arrow F in FIG. 3 represents the electromagnetic wave transmitted by the transmitting antenna 102. Dashed-dotted line arrows Fa represent a part of the electromagnetic wave transmitted by the transmitting antenna 102 that is a reflected wave reflected by the cover member B. A dotted line arrow Fb represents rest part of the electromagnetic wave transmitted by the transmitting antenna 102 that is an electromagnetic wave passing through the cover member B. For the purpose of illustration, a reflection at the radome 107 is ignored herein.

First, when the electromagnetic wave is transmitted from the transmitting antenna 102, that electromagnetic wave passes through the radome 107 and then arrives at the cover member B. Most part of the electromagnetic wave arriving at the cover member B passes through the cover member B and is transmitted toward the target outside the vehicle, but a part of the electromagnetic wave is reflected by the surface of the cover member B and returns back to the circuit board 101 by passing through the radome 107 again.

The electromagnetic wave that is back to the circuit board 101 is reflected by the circuit board 101 again and travels toward the cover member B side by passing through the radome 107. That electromagnetic wave repeats reflection between the cover member B and the board surface of the circuit board 101, and a part of that electromagnetic wave then arrives at the receiving antenna 103 (also referred to as "multiple reflection").

In this way, since the multiply reflected electromagnetic wave has a phase different from the reflected wave from the target, the multiply reflected electromagnetic wave and the reflected wave from the target affect their intensity each other depending on an angle of the reflected wave arriving at the receiving antenna 103. As a result, that multiply reflected electromagnetic wave locally has an angle that causes the receiving antenna 103 to be impossible to detect the reflected wave from the target (or an angle that decreases sensitivity of the detection). In addition, since that multiply reflected electromagnetic wave has a phase different from the reflected wave from the target when arriving at the receiving antenna 103, that multiply reflected electromagnetic wave also makes an error when estimating an azimuth of that target.

Another part of the electromagnetic wave reflected by the surface of the cover member B repeats reflections between the cover member B and other parts of the vehicle and returns back to the receiving antenna 103 through a complicated propagation route (not illustrated; also referred to as "diffracted wave"). Although this diffracted wave enters the receiving antenna 103 with some extent of delay, it is still difficult in signal processing to distinguish that diffracted wave and the reflected wave from the target. This diffracted wave may thus cause detection of an object that does not actually exist.

First Embodiment

[Configuration of Antenna Device]

In relation to reduction of effects of the above-described multiple reflection and diffracted wave, an embodiment of the present disclosure is described below.

Figure 4:
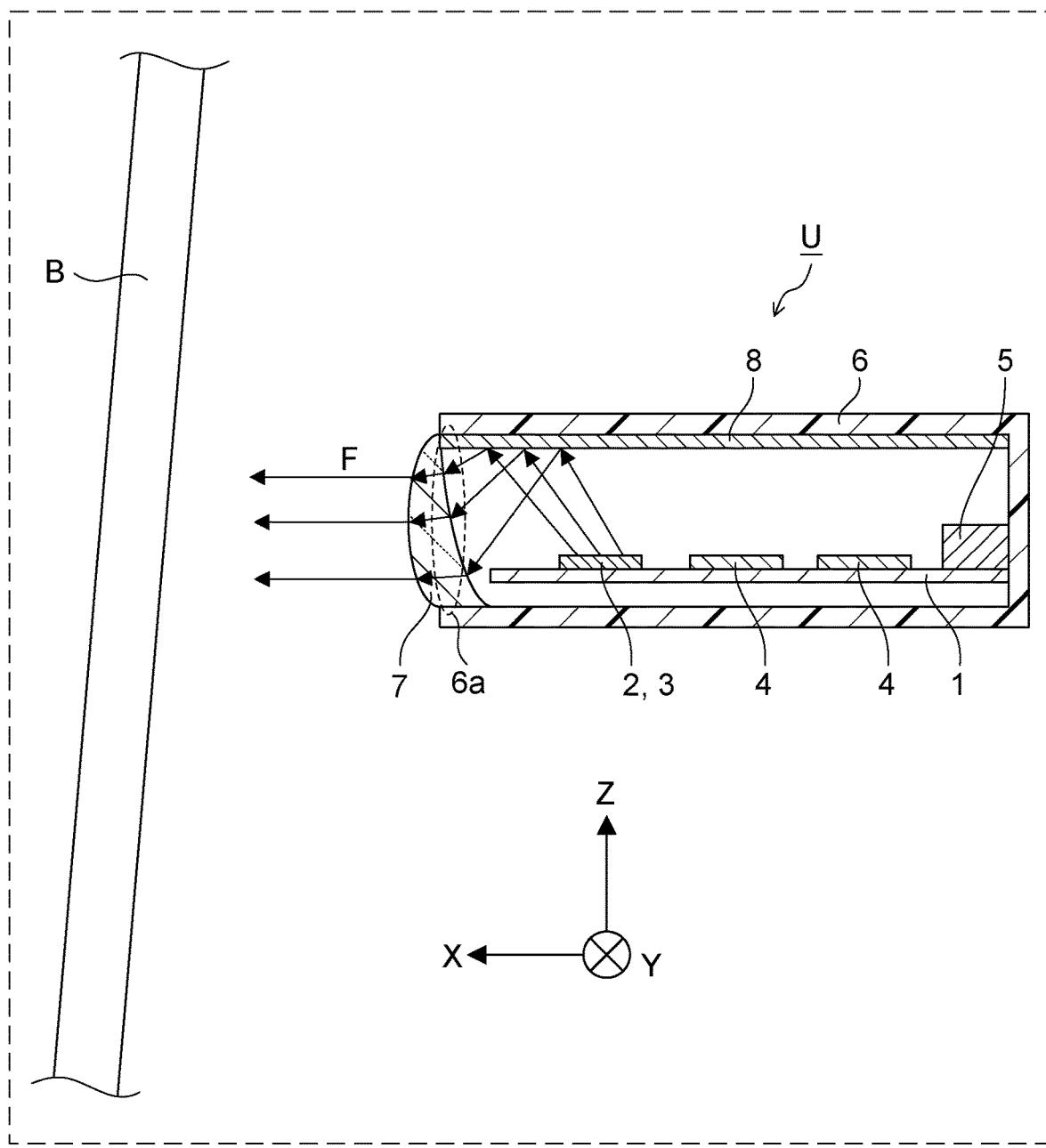
FIG. 4 is a side cross-sectional view of an antenna device according to a first embodiment.

FIG. 4 is a side cross-sectional view of an antenna device U according to a first embodiment. FIG. 5 is a plan view of the antenna device U according to the first embodiment.

The solid arrows F in the FIGS. 4 and 5 represent the electromagnetic waves transmitted by the transmitting antenna. Dotted line arrows Fr represent the reflected waves from the target. In FIGS. 4 and 5, illustration of a structure supporting the antenna device U in the vehicle C is omitted. In FIG. 5, illustration of the housing 6 is omitted.

For example, likewise the antenna device 100 according to the conventional technique, the antenna device U according to this embodiment is applied to a radar device and is disposed in the cover member B (here, bumper member B) of the vehicle C to transmit and receive the electromagnetic waves through that cover member B (see FIG. 1).

The antenna device U according to this embodiment includes a circuit board 1, a transmitting antenna 2, a receiving antenna 3, signal processing ICs 4, a connector 5, a housing 6, a dielectric lens 7, and a reflector 8.

In the antenna device U according to this embodiment, the circuit board 1 is disposed such that the board surface extends in the front-rear direction. The antenna device U according to this embodiment transmits the electromagnetic wave upward from the transmitting antenna 2 disposed on the board surface of that circuit board 1 and converts the traveling direction of the electromagnetic wave to the front direction side using the reflector 8 to transmit the electromagnetic wave to outside the device.

With such a configuration, the antenna device U according to this embodiment is disposed so as to intersect the extending direction of the board surface of the circuit board 1 with an extending direction of the cover member B (i.e., in such a way that the cover member B and the antenna surface do not face each other), and thus a situation is inhibited where the reflected wave from the cover member B multiply reflects between the cover member B and the antenna device U (e.g., circuit board 1, housing 6, and so on) and a part of that reflected wave reaches the receiving antenna 3.

The circuit board 1 is a board mounted with the transmitting antenna 2, the receiving antenna 3, the signal processing ICs 4, and the connector 5. A board surface of a front surface side or back surface side of the circuit board 1 is mounted with the transmitting antenna 2, the receiving antenna 3, the signal processing ICs 4, the connector 5, and so on while (not-illustrated) wiring for electrically connecting these mounted parts (the transmitting antenna 2, the receiving antenna 3, the signal processing ICs 4, the connector 5, and so on) are patterned.

The circuit board 1 is disposed such that the board surface extends in the front-rear direction based on the front region where the object is to be detected.

Material of the circuit board 1 is not specifically limited in the present disclosure; however, it is possible to use a printed circuit board (PCB), for example. Also, a multi-layer board and a semi-conductor board mounted with the signal processing ICs 4 may also be used as the circuit board 1. The circuit board 1 is, for example, in a flat plate shape.

The transmitting antenna 2 is disposed on the board surface of the front or back surface side of the circuit board 1 and transmits the electromagnetic wave to above the board surface of the circuit board 1. Likewise, the receiving antenna 3 is disposed on the board surface of the circuit board 1 and receives the reflected wave from above the board surface. In other words, the transmitting antenna 2 and the receiving antenna 3 have directivity characteristics of transmitting and receiving in a substantially normal direction of the board surface of the circuit board 1.

Note that "above the board surface of the circuit board 1" means the Z-axis positive direction when the board surface is the front surface side of the circuit board 1 and means a Z-axis negative direction when the board surface is the back surface side of the circuit board 1 (the same applies hereinafter). However, "above the board surface of the circuit board 1" as directivity directions of the transmitting antenna 2 and the receiving antenna 3 is a substantially Z-axis positive direction or Z-axis negative direction also including an angle inclining in ±X direction or ±Y direction.

For example, a patch antenna having the directivity characteristics in the normal direction of the board surface is applied as the transmitting antenna 2 and the receiving antenna 3. The antenna having the directivity characteristics in the normal direction of the board surface like the patch antenna easily acquires high gain.

Note that the transmitting antenna 2 and the receiving antenna 3 may at least have a conductor pattern formed on the circuit board 1, and a slot antenna and the like may be applied thereto. The transmitting antenna 2 and the receiving antenna 3 may be composed of a single antenna commonly used for transmitting and receiving the electromagnetic waves.

Each of the transmitting antenna 2 and the receiving antenna 3 is composed of multiple antenna elements formed on the board surface of the circuit board 1 (in FIG. 5, the transmitting antenna 2 is composed of 20 patch antennae (antenna elements) while the receiving antenna 3 is composed of 20 patch antennae (antenna elements)). The transmitting antenna 2 and the receiving antenna 3 according to this embodiment have structures in which the multiple antenna elements are arranged as an array along the X direction so as to incline the transmission and reception directions from the normal line direction of the board surface (i.e., phased array antenna) (the same applies to second to fourth embodiments and sixth to eighth embodiments).

The electromagnetic wave that the transmitting antenna 2 transmits above is reflected by the reflector 8, and the traveling direction thereof is converted to the front direction. The electromagnetic wave reflected by the reflector 8 is transmitted toward the dielectric lens 7 to be converted to a plane wave by the dielectric lens 7 and is transmitted in the front direction (here, substantially horizontal direction) to outside the antenna device U.

The returning reflected wave reflected by the target outside the device is collected into the dielectric lens 7 and transmitted to the reflector 8 side. The traveling direction of the reflected wave reflected by the reflector 8 is then converted to the receiving antenna 3 side of the circuit board 1.

Each signal processing IC 4 (corresponding to a signal processing unit of the present invention) transmits a driving signal with a high frequency (e.g., millimeter-wave frequency band) to the transmitting antenna 2 to allow the transmitting antenna 2 to transmit the electromagnetic waves (e.g., electromagnetic waves from a pulse compression method with pulse sequences or electromagnetic waves as sequential waves with modulated frequency).

The signal processing IC 4 receives a reflected wave signal from the receiving antenna 3 and applies object detection processing (e.g., detection processing and frequency analysis processing) to that reflected wave signal to detect a distance to the target (e.g., vehicle or person), an azimuth where the target exists, and additionally a reflection strength and speed of the target. For example, the signal processing IC 4 uses a method of scanning the transmission direction of the electromagnetic waves transmitted from the transmitting antenna 2 or detecting a received phase difference of the reflected wave signals respectively received by radiation elements of the receiving antenna 3 arranged as an array to estimate the azimuth of the target.

The processing performed by the signal processing IC 4 is similar to a known configuration; thus, a detailed description thereof is omitted herein. A part of the processing performed by the signal processing IC 4 may be executed by external equipment such as a vehicle ECU.

For example, the signal processing IC 4 is composed mainly of a known microcomputer including a CPU, a ROM, a RAM, and so on, and is additionally composed of a driving circuit that generates a high-frequency driving signal transmitted to the transmitting antenna 2 and a detection circuit for processing of receiving the reflected wave signal from the receiving antenna 3. However, a part of the signal processing IC 4 can be mounted only with a dedicated hardware having no CPU and so on.

In FIG. 5, as an example of the signal processing ICs 4, a signal processing IC for the transmitting antenna 2 that performs signal processing related to a millimeter-wave band, a signal processing IC for the receiving antenna 3 that performs signal processing related to a millimeter-wave band, and a signal processing IC that performs signal processing related to a baseband are illustrated as individual chips.

The connector 5 communicably connects the signal processing ICs 4 and the external equipment (e.g., vehicle ECU mounted in vehicle C).

The housing 6 houses the circuit board 1 while supporting the dielectric lens 7 and the reflector 8 forward of the circuit board 1. For example, the housing 6 houses the circuit board 1 in a substantially sealed state.

An outer shape of the housing 6 is, in terms of miniaturization, a shape along an outer shape of the circuit board 1 (e.g., rectangular shape) having a length in the Z direction shorter than a length in the X direction, for example. The length in the Z direction of the housing 6 is, for example, set as a length that is the sum of an aperture length and a predetermined margin width that can obtain desirable gain when transmitting and receiving the electromagnetic wave.

In terms of preventing the reflected wave from the cover member B from entering the housing 6, improving characteristics of heat release from the circuit board 1, improving EMC characteristics, and the like, a metal member (e.g., aluminum material) is used as material of the housing 6, for example. However, when considering more about cost and weight saving, resin may be used as the material of the housing 6, or the housing 6 and the dielectric lens 7 may be integrally formed of the same resin material. For example, the material of the housing 6 is material with higher heat conductivity than the dielectric lens 7.

On a front surface of the housing 6, a window 6a for transmitting and receiving the electromagnetic waves to and from the transmitting antenna 2 and the receiving antenna 3 is formed. The window 6a is a window surface of the housing 6. The window 6a is provided with the dielectric lens 7. The window 6a is, for example, an aperture formed in substantially the same size with a beam width of the electromagnetic waves transmitted by the transmitting antenna 2.

A wall region of walls of the housing 6 that does not allow the electromagnetic waves to pass therethrough, for example, extends to the front of positions where the transmitting antenna 2 and the receiving antenna 3 are disposed. This makes it possible to further inhibit the reflected wave from the cover member B from entering the housing 6.

The reflector 8 reflects the electromagnetic waves transmitted above from the transmitting antenna 2 and converts the traveling direction of the electromagnetic waves to the front direction side to transmit the electromagnetic waves thereto, while converting the traveling direction of the reflected wave from the front side to the board surface side of the circuit board 1 to transmit the reflected wave to the receiving antenna 3. When the transmitting antenna 2 is configured to transmit the electromagnetic waves downward, the reflector 8 may be disposed below the board surface of the circuit board 1.

The reflector 8 is, for example, supported at an inner wall surface of the housing 6 and disposed above the board surface of the circuit board 1 so as to cover the transmitting antenna 2 and the receiving antenna 3. The region on which the reflector 8 is disposed is not necessarily the entire upper surface of the housing 6 and may be set to cover only front side from the transmitting antenna 2 and the receiving antenna 3.

A shape of a reflection surface of the reflector 8 is, for example, a mirror polished flat surface or curved surface. The reflection surface of the reflector 8 may be formed substantially parallel to the board surface of the circuit board 1 or formed to have an inclination angle. FIG. 4 illustrates an aspect where the reflector 8 is composed of a reflection plate having a flat surface substantially parallel to the board surface of the circuit board 1.

Material of the reflector 8 may be, for example, a metal member that is integrally formed with the walls of the housing 6. The reflector 8 may be a resin member with a surface coated with metal plating.

The dielectric lens 7 is supported forward of the circuit board 1 and narrows a beam of the electromagnetic waves from the reflector 8 (i.e., transmission waves) to emit it to the front region outside the antenna device U. The dielectric lens 7 then collects the reflected wave, which is the transmitted electromagnetic wave returning back from the target into the reflector 8.

The dielectric lens 7 increases gain of the transmission and reception of the electromagnetic waves by the transmitting antenna 2 and the receiving antenna 3 and also inhibits the reflected waves from the cover member B from entering the receiving antenna 3 (detail is described later). The dielectric lens 7 also functions as a radome that protects the transmitting antenna 2 and the receiving antenna 3.

For example, a one-side convex lens on which a front surface (in the X-axis positive direction) is formed in a convex shape can be applied as the dielectric lens 7. Note that a two-sides convex lens, a ball lens, a Fresnel lens, or a combination of these, and a combination of a concave lens and these may also be applied as the dielectric lens 7. In addition, a back surface side of the dielectric lens 7 may be convex in an X-axis negative direction.

Material of the dielectric lens 7 is arbitrary, and, for example, acrylic resin, tetrafluoroethylene resin, polystyrene resin, polycarbonate resin, polybutylene terephthalate resin, polyphenylene resin, polypropylene resin, syndiotactic polystyrene resin, ABS resin, or the like is used.

A shape of the dielectric lens 7 according to this embodiment is a convex shape only in the X-axis positive direction so as to not narrow the beam in the Y direction (see FIG. 5). In other words, a shape of a cross-section of a side surface of the dielectric lens 7 in the Y direction has substantially the same shape in any positions. This prevents deterioration of object detection accuracy, which is caused by the electromagnetic waves respectively transmitted from the multiple antenna elements of the transmitting antenna 2 disposed along the Y direction that are oriented in different directions from each other when arriving at the receiving antenna 3 (e.g., accuracy deterioration due to mutual interference or accuracy deterioration due to variation of phase difference).

Meanwhile, to enable identification of the electromagnetic waves respectively transmitted from the multiple antenna elements of the transmitting antenna 2, it is possible to allow the multiple antenna elements of the transmitting antenna 2 to respectively operate in time-sharing or to make polarization directions of the electromagnetic waves respectively transmitted from the multiple antenna elements of the transmitting antenna 2 different from each other.

In the antenna device U according to this embodiment, the electromagnetic wave transmitted from the transmitting antenna 2 is transmitted outside the antenna device U through the dielectric lens 7 and the reflector 8. Thus, it is desirable that the shape of the dielectric lens 7, the shape of the reflection surface of the reflector 8, the position where the transmitting antenna 2 (and receiving antenna 3) is disposed, and the directivity direction of the transmitting antenna 2 (and receiving antenna 3) are designed integrally such that the electromagnetic waves transmitted to outside the antenna device U become plane waves.

In terms of this, in FIG. 4, the shape of the reflection surface of the reflector 8 is set as a flat surface shape substantially parallel to the board surface of the circuit board 1 while the shape of the dielectric lens 7 is set as a shape having a greater refractive index in a lower side.

[Behavior of Electromagnetic Wave when Antenna Device is in Operation]

Next, behavior of the electromagnetic wave when the antenna device U according to this embodiment is in operation is described with reference to FIGS. 6A, 6B, and 7.

Figure 6A:
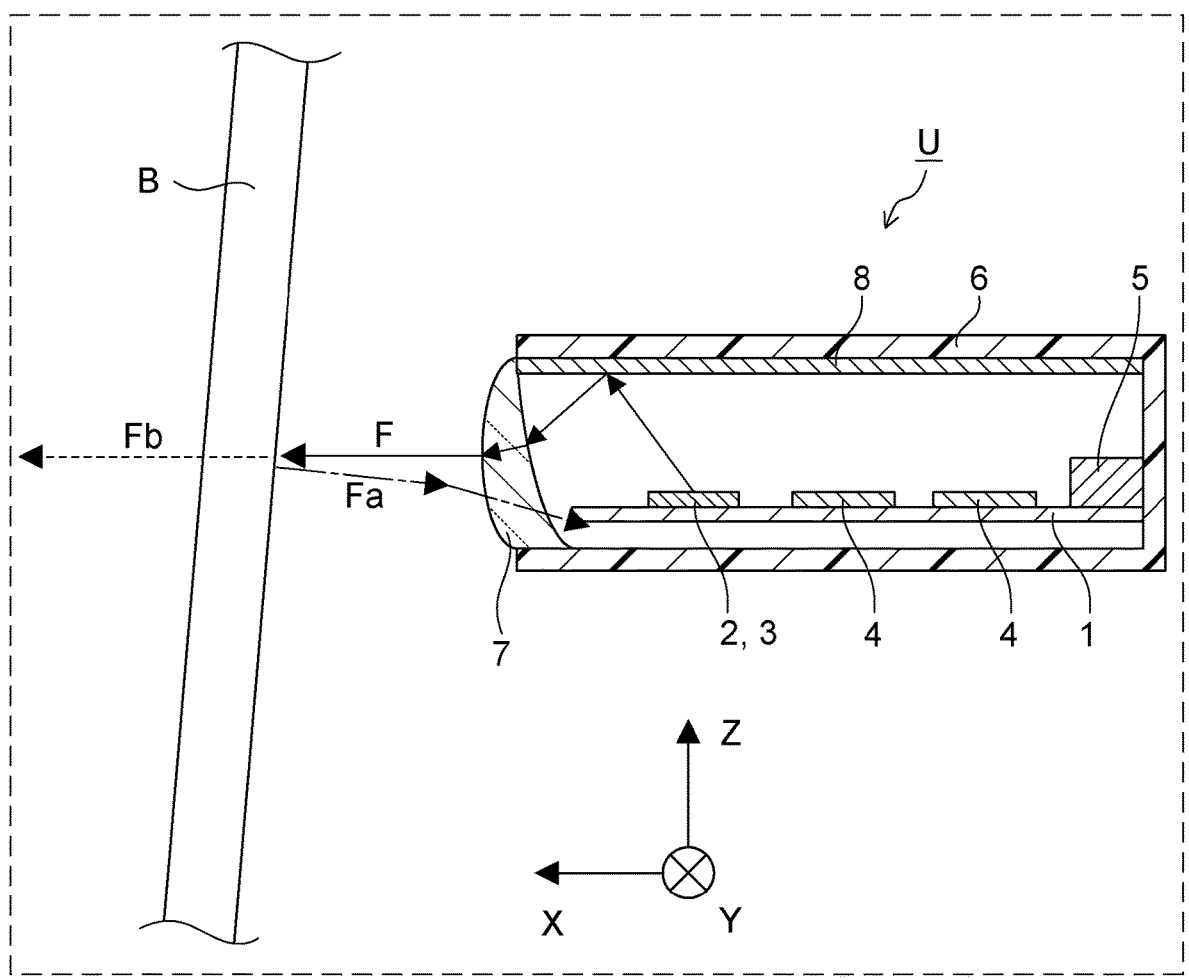
FIG. 6A is a diagram that illustrates behavior of an electromagnetic wave when the antenna device according to the first embodiment is in operation.
Figure 6B:
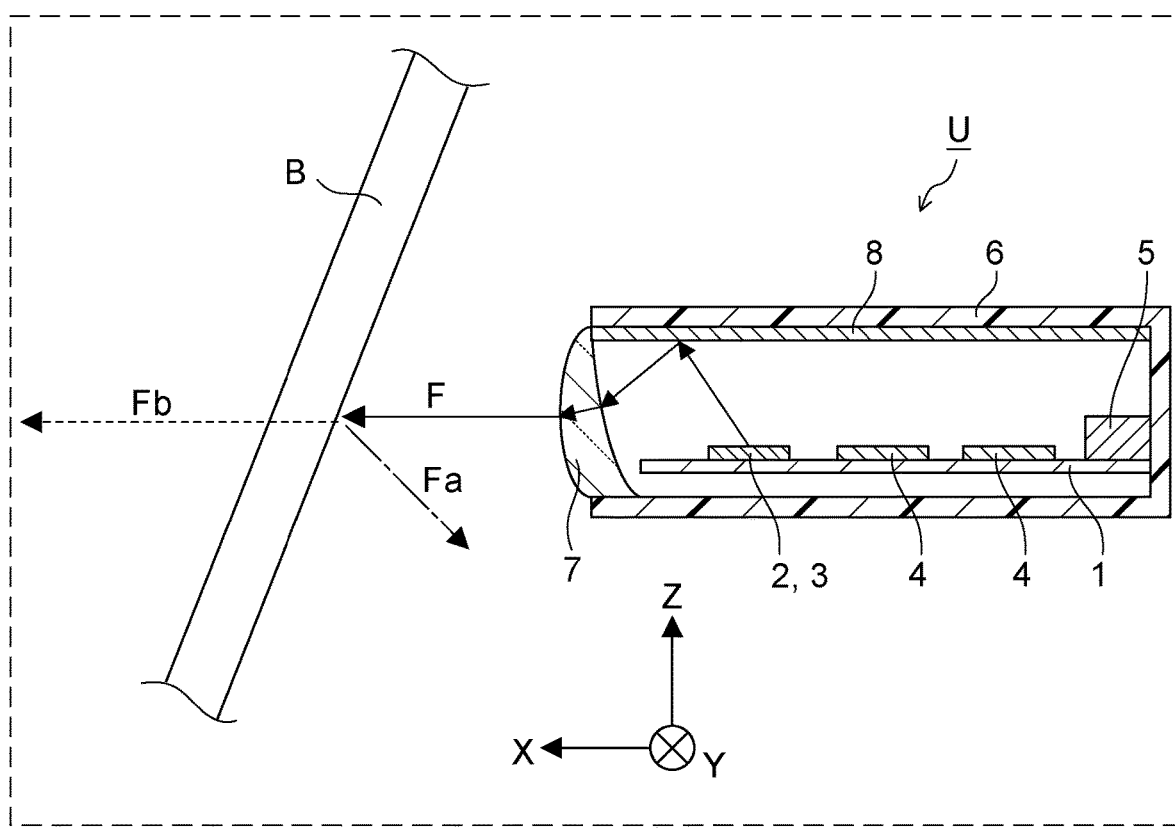
FIG. 6B is a diagram that illustrates behavior of an electromagnetic wave when the antenna device according to the first embodiment is in operation.

FIGS. 6A and 6B are diagrams that illustrate behavior of the electromagnetic wave when the antenna device U according to this embodiment is in operation. FIG. 6A illustrates behavior of the electromagnetic wave when the positional relationship between the antenna device U and the cover member B is the same as that in FIG. 4. FIG. 6B illustrates behavior of the electromagnetic wave when the positional relationship between the antenna device U and the cover member B is different from that in FIG. 4 for the purpose of illustration.

The solid arrow F in each of FIGS. 6A and 6B represents the electromagnetic wave transmitted by the antenna device U. The dashed-dotted line arrow Fa represents a part of the electromagnetic wave transmitted by the transmitting antenna 2 that is the reflected wave reflected by the cover member B. The dotted line arrow Fb represents rest part of the electromagnetic wave transmitted by the transmitting antenna 2 that is an electromagnetic wave passing through the cover member B.

As described above with reference to FIG. 3, the electromagnetic wave F transmitted from the transmitting antenna 2 is partially reflected by the cover member B and becomes the reflected wave Fa returning back to the antenna device U side.

However, in the antenna device U according to this embodiment, differing from the antenna device 100 according to the conventional technique, the electromagnetic wave is transmitted and received substantially parallel to the board surface of the circuit board 1 by converting the traveling direction of the electromagnetic wave using the reflector 8 disposed above the board surface of the circuit board 1. Thus, the extending direction of the board surface of the circuit board 1 is disposed so as to intersect with the extending direction of the cover member B. That is, the board surface of the circuit board 1 and the cover member B do not face each other.

Thus, most part of the reflected wave Fa from the cover member B does not enter the housing 6 and is deviated and scattered above and under the housing 6. Also, the reflected wave Fa hitting the housing 6 is not reflected again toward the cover member B side and is deviated and scattered behind the housing 6.

In addition, in the antenna device U according to this embodiment, the transmitting antenna 2 and the receiving antenna 3 on the circuit board 1 respectively transmits and receives the electromagnetic wave through the dielectric lens 7.

Thus, also a part of the reflected wave Fa from the cover member B arriving at the dielectric lens 7 enters a non-flat surface portion of that dielectric lens 7 and is scattered without being collected into the receiving antenna 3. That is, although if the reflected wave Fa arriving at the dielectric lens 7 passes through the dielectric lens 7, the reflected wave Fa arriving from an angle different from a predetermined angle is not collected at the position of the receiving antenna 3, and thus the reflected wave Fa will be scattered inside the housing 6 or dispersed and scattered outside the housing 6. When the reflected wave Fa is reflected by the dielectric lens 7, an angle of the reflection varies by an angle of the surface of the dielectric lens 7 (e.g., when the dielectric lens 7 is a convex lens, the angle of the reflection varies to a direction away from the antenna device); thus, that reflected wave Fa is scattered without causing the multiple reflection.

In this way, in the antenna device U according to this embodiment, the reflected wave Fa from the cover member B is scattered without being multiply reflected between the circuit board 1 and the housing 6. Likewise, in the antenna device U according to this embodiment, the reflected wave Fa from the cover member B diffracts and is thus inhibited from arriving at the position of the receiving antenna 3. Meanwhile, the reflected wave from the object is not disturbed by the above configuration and follows the same route with the transmitted electromagnetic wave to arrive at the position of the receiving antenna 3.

Figure 7:
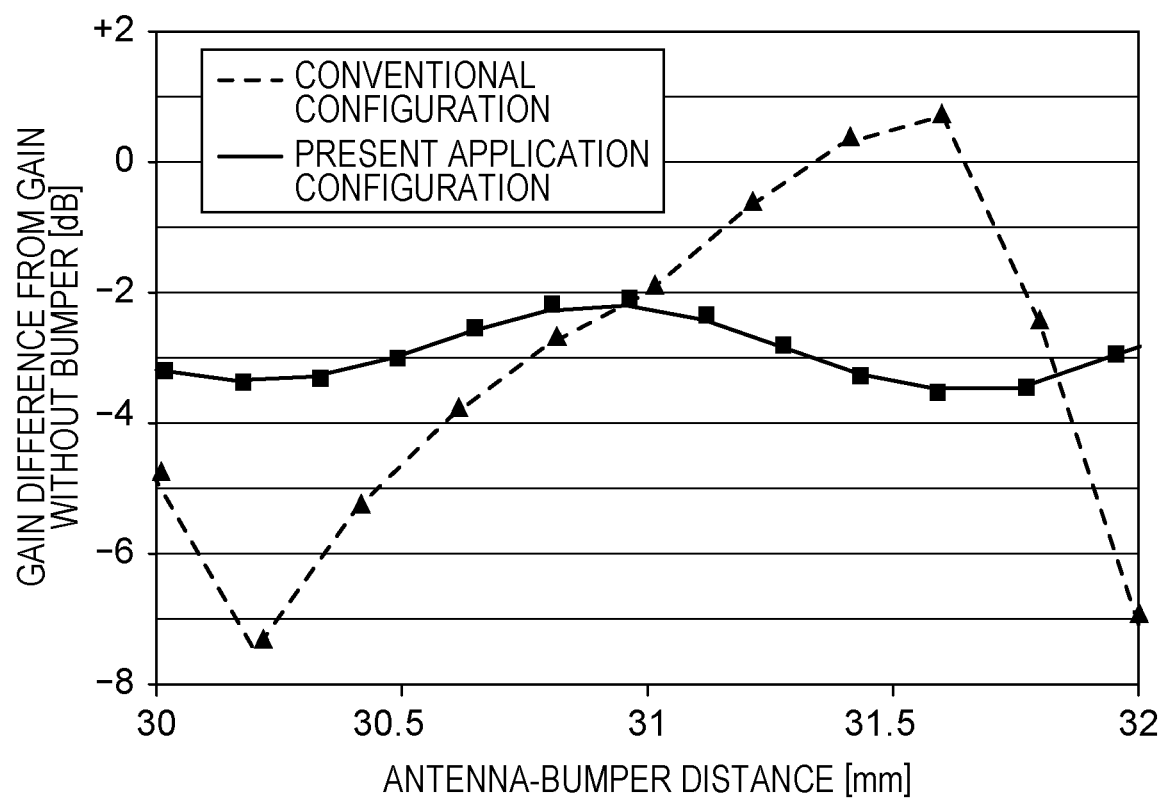
FIG. 7 is a graph that illustrates a result of a simulation of verifying a radar performance of the antenna device according to the first embodiment.

FIG. 7 is a graph that illustrates a result of a simulation of verifying a radar performance of the antenna device U according to this embodiment.

This simulation is calculation of radio field strength (i.e., gain) of the reflected wave from a predetermined target, which is received by the receiving antenna 3, at different distances between the cover member B and the transmitting antenna 2 (and receiving antenna 3) in the antenna device U.

In FIG. 7, a result of the simulation of the antenna device U according to this embodiment (see FIG. 4) is illustrated with a solid line graph while a result of the simulation of the antenna device 100 according to the conventional technique (see FIG. 2) is illustrated with a dotted line graph. Each of the solid line graph and the dotted line graph is plots of the simulation result connected with a line.

In FIG. 7, the vertical axis of the graph indicates the radio field strength of the reflected wave from the predetermined target, which is received by the receiving antenna 3 (here, the radio field strength is indicated by comparing with radio field strength in a case where no cover member B is interposed), while the horizontal axis of the graph indicates a distance between the cover member B and the transmitting antenna 2 (and receiving antenna 3).

As seen from FIG. 7, in the antenna device 100 according to the conventional technique, regions where the radio field strength becomes weaker appear in multiple positions (in FIG. 7, position of 30.25 mm and position of 32.0 mm) depending on the distance between the cover member B and the transmitting antenna 102. This indicates that, in the antenna device 100 according to the conventional technique, a small difference in the distance between the cover member B and the transmitting antenna 102 (or difference in angle) causes the reflected wave Fa from the cover member B to interfere with the reflected wave from the target, and thus there is a region where the detection accuracy is locally deteriorated.

In this regard, the antenna device U according to this embodiment has no region where the radio field strength becomes weaker depending on the distance between the cover member B and the transmitting antenna 2. That is, in the antenna device U according to this embodiment, since the interference of the reflected wave Fa from the cover member B with the reflected wave from the target can be inhibited, the detection accuracy is thus substantially uniform without depending on the positional relationship between the cover member B and the transmitting antenna 2. In particular, this result indicates that, in the antenna device U according to this embodiment, the radar performance for estimating an azimuth of a position of the target is improved.

[Effect]

As described above, according to the antenna device U of this embodiment, the circuit board 1 is disposed such that the board surface extends in the front-rear direction, and the transmitting antenna 2 and the receiving antenna 3 respectively transmits and receives the electromagnetic waves to and from outside the antenna device U through the reflector 8 that converts the traveling direction of the electromagnetic waves. Thus, in the antenna device U according to this embodiment, the antenna device U is disposed such that the extending direction of the board surface of the circuit board 1 intersects with the extending direction of the cover member B (i.e., such that the cover member B and the antenna surface do not face each other).

This makes it possible to inhibit the multiple reflection of the reflected wave from the cover member B between the cover member B and the antenna device U (e.g., circuit board 1 or housing 6) and arrival of a part of that reflected wave at the receiving antenna 3. This, for example, makes it possible to acquire the gain uniformly in any azimuth in the antenna device U, and thus the accuracy of the azimuth estimation can be improved. Also it is possible to inhibit decrease of output gain due to canceling out of phases by the multiple reflection between the cover (bumper) member and the antenna device U. The antenna device U according to this embodiment is particularly useful in terms of acquiring the above effects without depending on the shape of the cover member B.

Since a patch antenna and the like having directivity characteristics in the normal direction of the board surface of the circuit board 1 can be applied as the transmitting antenna 2 and the receiving antenna 3, it is possible to acquire high gain and the azimuth estimation for the object detection is facilitated in the antenna device U.

According to the antenna device U of this embodiment, the electromagnetic waves are transmitted and received to and from outside the antenna device U through the dielectric lens 7. This makes it possible to increase the gain and to further inhibit arrival of the reflected wave from the cover member B at the receiving antenna 3.

According to the antenna device U of this embodiment, the electromagnetic waves are transmitted and received through the window 6*a* having about the same size with a beam diameter of the transmitted electromagnetic wave. This inhibits the reflected wave from the cover member B from entering the housing 6.

Second Embodiment

Next, an example of a configuration of an antenna device U according to a second embodiment is described with reference to FIG. 8.

Figure 8:
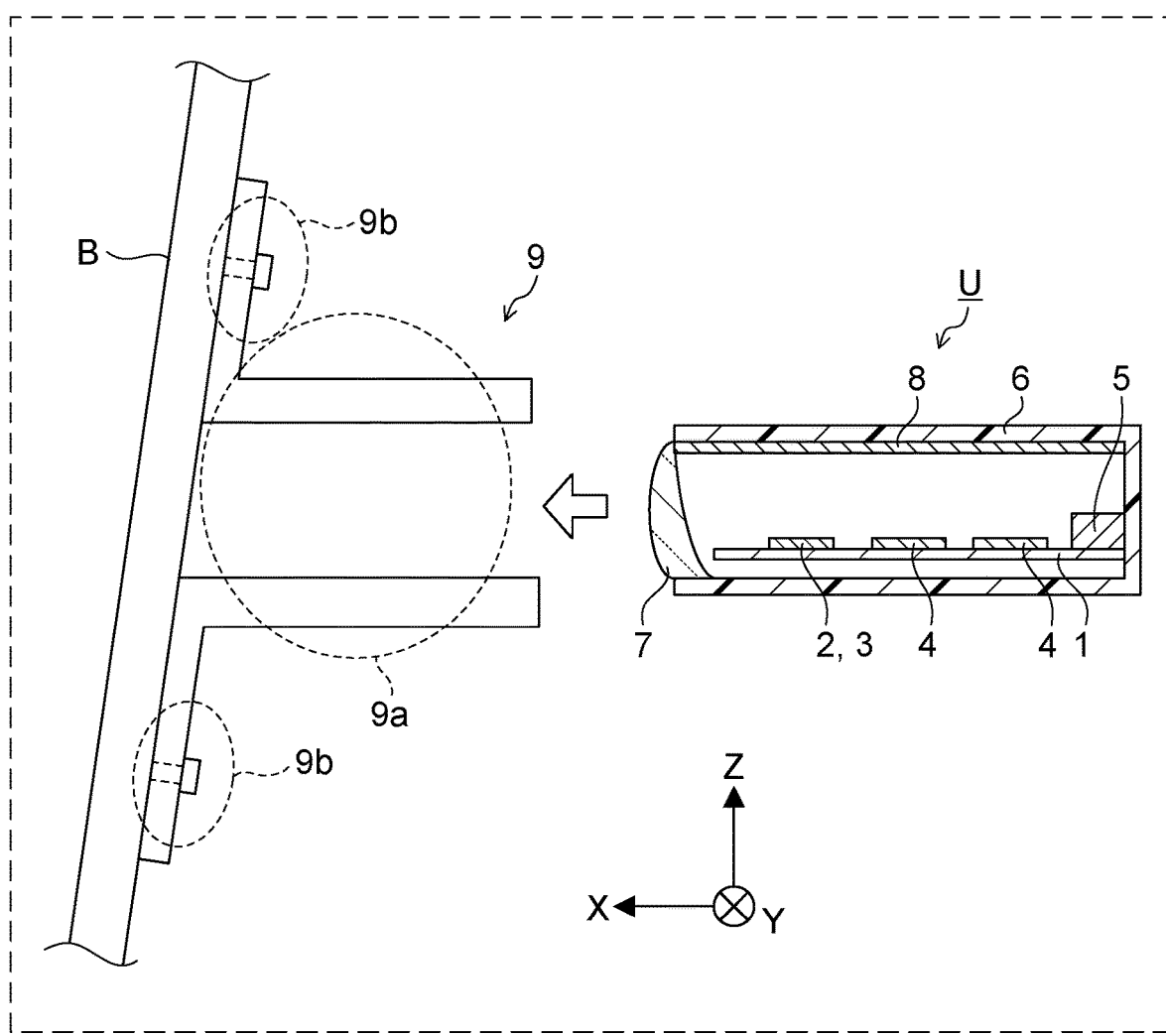
FIG. 8 is a side cross-sectional view of an antenna device according to a second embodiment.

FIG. 8 is a side cross-sectional view of the antenna device U according to the second embodiment.

The antenna device U according to this embodiment is different from the antenna device U according to the first embodiment in that the antenna device U according to this embodiment has a bracket 9 for fixing the housing 6 and the like on the cover member B. Descriptions of configurations common to the first embodiment are omitted (the same applies hereinafter for other embodiments).

The bracket 9 fixes the housing 6 on the cover member B and defines the direction in which the antenna device U transmits and receives the electromagnetic waves.

The bracket 9 has, for example, a storage part 9*a* that stores the antenna device U and fixing parts 9*b* that are fixed on the cover member B.

For example, the storage part 9*a* is in a cylindrical shape that allows the housing 6 to be inserted therein from the front surface (i.e., surface on which the dielectric lens 7 is mounted) and forms a storage space following the outer shape of the housing 6. The storage part 9*a* has an aperture in the region of the front surface of the antenna device U on which the dielectric lens 7 is disposed so as to allow the antenna device U to transmit and receive the electromagnetic waves.

The fixing parts 9*b* are parts that are fixed on the cover member B with a double-sided tape, bolts, and so on. A method of fixing the fixing parts 9*b* on the cover member B is arbitrary and ultrasonic welding and the like may also be used.

With the above configuration, the bracket 9 fixes the housing 6 on the cover member B such that the direction in which the electromagnetic waves are transmitted and received by the antenna device U is horizontal to the ground, for example. This enables the object detection of the target around the vehicle C.

Material of the bracket 9 is, for example, an electromagnetic wave absorber or material containing the electromagnetic wave absorber. This makes it possible to further inhibit the diffracted wave from entering the housing 6.

The bracket 9 may include an adjustment mechanism (e.g., using pin joint and fixing joint) that can change the angle of the transmission and reception direction of the electromagnetic waves. Using this adjustment mechanism enables fine adjustment of the transmission and reception direction of the electromagnetic waves.

As described above, the antenna device U according to this embodiment can transmit and receive the electromagnetic waves in a desirable direction (e.g., direction horizontal to ground) while remaining mechanical stability.

Third Embodiment

Next, an example of a configuration of an antenna device U according to a third embodiment is described with reference to FIG. 9.

Figure 9:
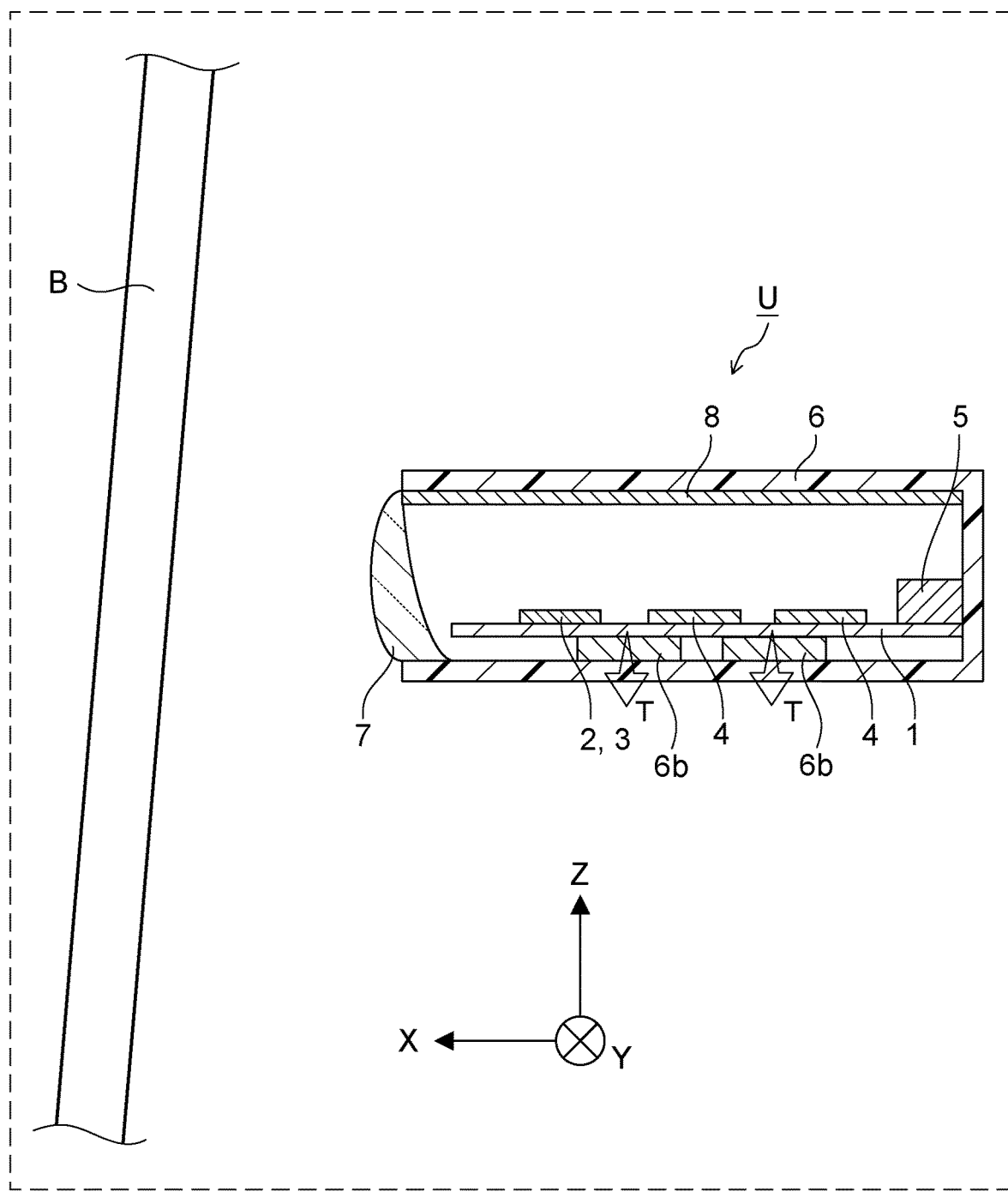
FIG. 9 is a side cross-sectional view of an antenna device according to a third embodiment.

FIG. 9 is a side cross-sectional view of the antenna device U according to the third embodiment.

The antenna device U according to this embodiment is different from the antenna device U according to the first embodiment in that the housing 6 has connection units 6b that thermally bond with the circuit board 1 or circuit parts mounted on that circuit board 1 (e.g., signal processing ICs 4).

FIG. 9 illustrates a state where the connection units 6b thermally bond the wall of the housing 6 and the circuit board 1. White arrows T in FIG. 9 represent heat flows from the circuit board 1.

In this embodiment, a metal member with high heat release characteristics is used as the material of the housing 6, for example. The connection units 6b then thermally bond the wall of the housing 6 and the circuit board 1 or the circuit parts mounted on that circuit board 1.

The configuration of the connection units 6b is arbitrary; the connection units 6b may be integrally formed with the wall of the housing 6 or may be made of silicon grease or bond material such as epoxy resin. Otherwise the connection units 6b may be a member in a form of putty, rubber, gel, or a compound.

Since the antenna device U according to the present disclosure allows the entire region of the housing 6 except the front surface to be a wall region that can release heat, the antenna device U according to the present disclosure can acquire a wider wall region of the housing 6 that can release heat than the antenna device 100 according to the conventional technique (see FIG. 2). Thus, the configuration for releasing heat from the housing 6 using the connection units 6b is particularly effective for improving the characteristics of heat release from the circuit board 1 in the antenna device U according to the present disclosure.

As described above, the antenna device U according to this embodiment can improve the heat release characteristics of the circuit board 1 and the like.

Fourth Embodiment

Next, an example of a configuration of an antenna device U according to a fourth embodiment is described with reference to FIG. 10.

Figure 10:
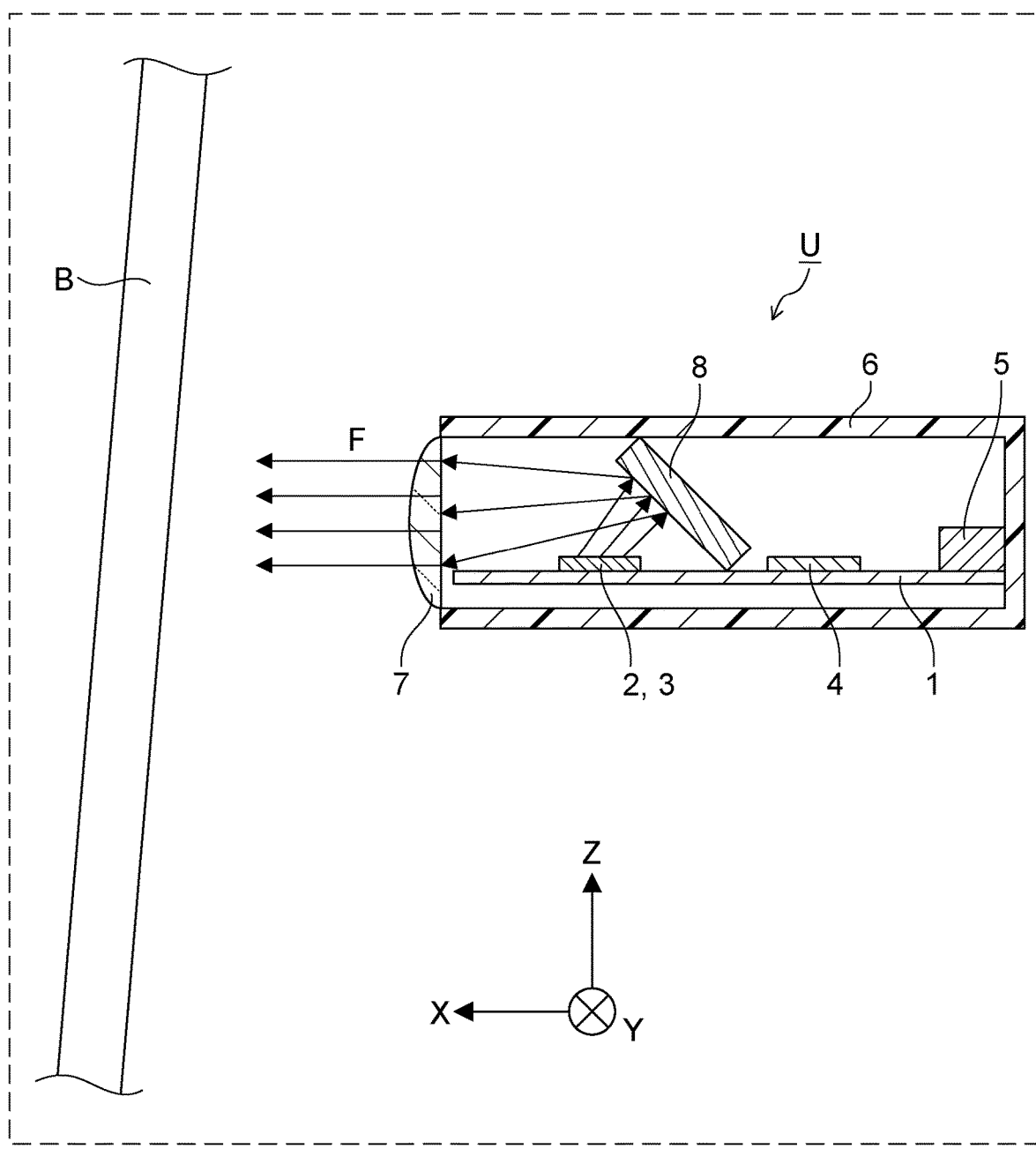
FIG. 10 is a side cross-sectional view of an antenna device according to a fourth embodiment.

FIG. 10 is a side cross-sectional view of the antenna device U according to the fourth embodiment.

The antenna device U according to this embodiment is different from that of the antenna device U according to the first embodiment in the configuration of the reflector 8.

The reflector 8 according to this embodiment is disposed such that the reflection surface is inclined in the Z-axis positive direction with respect to the board surface of the circuit board 1. The reflector 8 is supported to keep a specific angle by the circuit board 1 or the housing 6.

The directivity direction of the electromagnetic waves of the transmitting antenna 2 and the receiving antenna 3 according to this embodiment is inclined from above the board surface of the circuit board 1 to the rear direction side (X-axis negative direction).

With the above configuration, the antenna device U according to this embodiment can allow the traveling direction of the electromagnetic waves transmitted from the transmitting antenna 2 to be parallel to a substantially X-axis positive direction using the reflector 8. That is, in the antenna device U according to this embodiment, the inclination angle of the reflection surface of the reflector 8 and the transmission direction of the electromagnetic waves are set such that the reflection direction of the electromagnetic waves at the reflector 8 is the substantially X-axis positive direction.

As described above, the antenna device U according to this embodiment is particularly useful in terms of not requiring an asymmetry design of the shape of the dielectric lens 7 depending on its position in the vertical directions.

Fifth Embodiment

Next, an example of a configuration of an antenna device U according to a fifth embodiment is described with reference to FIG. 11.

Figure 11:
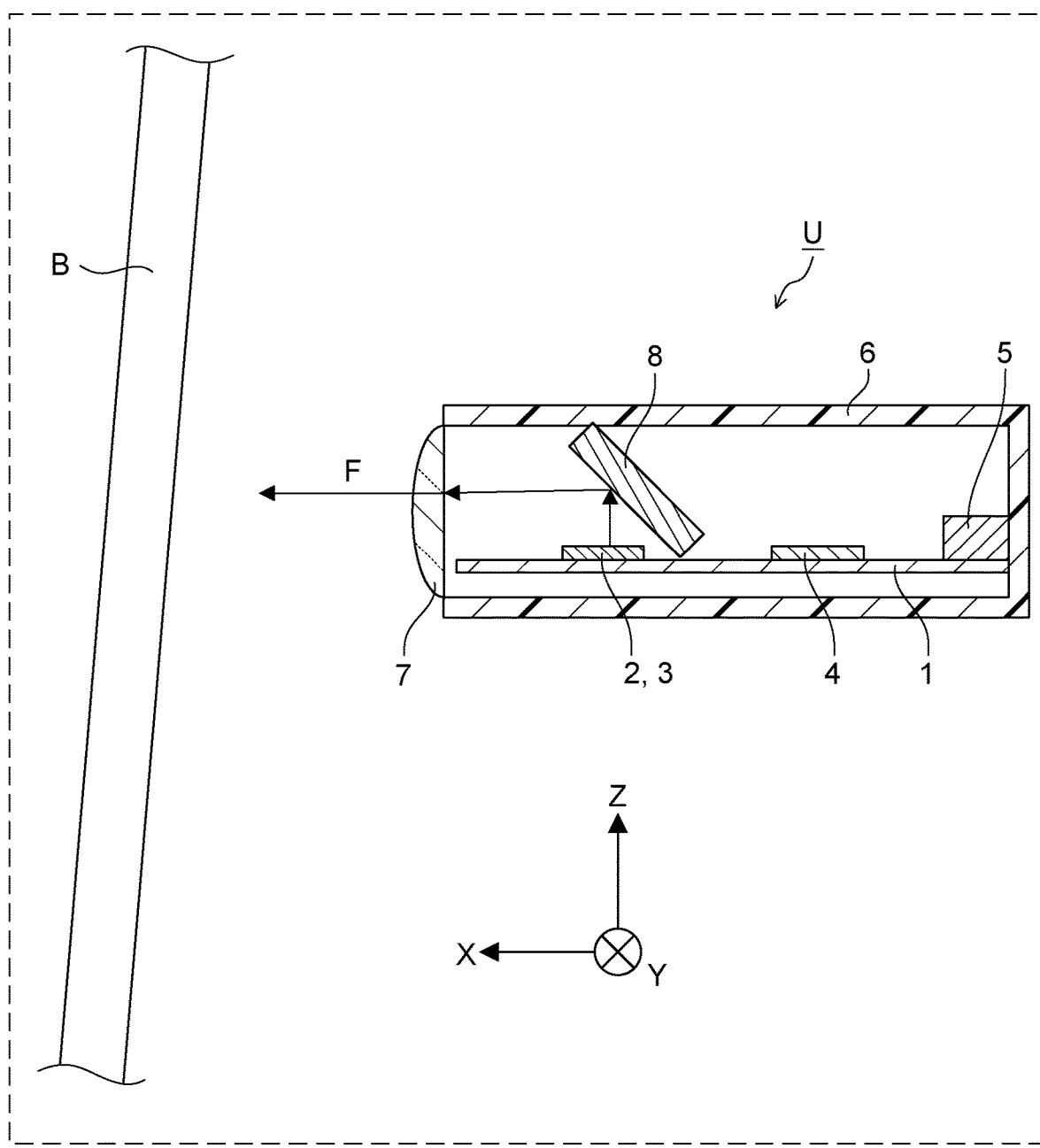
FIG. 11 is a side cross-sectional view of an antenna device according to a fifth embodiment.

FIG. 11 is a side cross-sectional view of the antenna device U according to the fifth embodiment.

The antenna device U according to this embodiment is different from those of the antenna device U according to the first embodiment in the configurations of the transmitting antenna 2 and the receiving antenna 3 and the configuration of the reflector 8.

The reflector 8 according to this embodiment is disposed such that the reflection surface is inclined in the Z direction at substantially 45 degrees with respect to the board surface of the circuit board 1.

The transmitting antenna 2 and the receiving antenna 3 according to this embodiment are respectively composed of a single patch antenna. In other words, the directivities of the transmitting antenna 2 and the receiving antenna 3 are in substantially the same direction with the normal direction of the board surface of the circuit board 1.

That is, the antenna device U according to this embodiment is set such that the direction in which the electromagnetic waves are transmitted and received to and from outside the device can be the X direction by adjusting the reflection surface of the reflector 8 even when the transmitting antenna 2 and the receiving antenna 3 are respectively composed of the single patch antenna. Note that, in terms of executing the azimuth estimation, the number of the antenna elements of the transmitting antenna 2 and the receiving antenna 3 in the Y direction are desirably multiple such that the antenna elements are arranged as an array.

As described above, the antenna device U according to this embodiment is useful since the transmitting antenna 2 and the receiving antenna 3 can be composed of the single antenna elements individually and thus the signal processing is facilitated.

Sixth Embodiment

Next, an example of a configuration of an antenna device U according to a sixth embodiment is described with reference to FIGS. 12 and 13.

Figure 12:
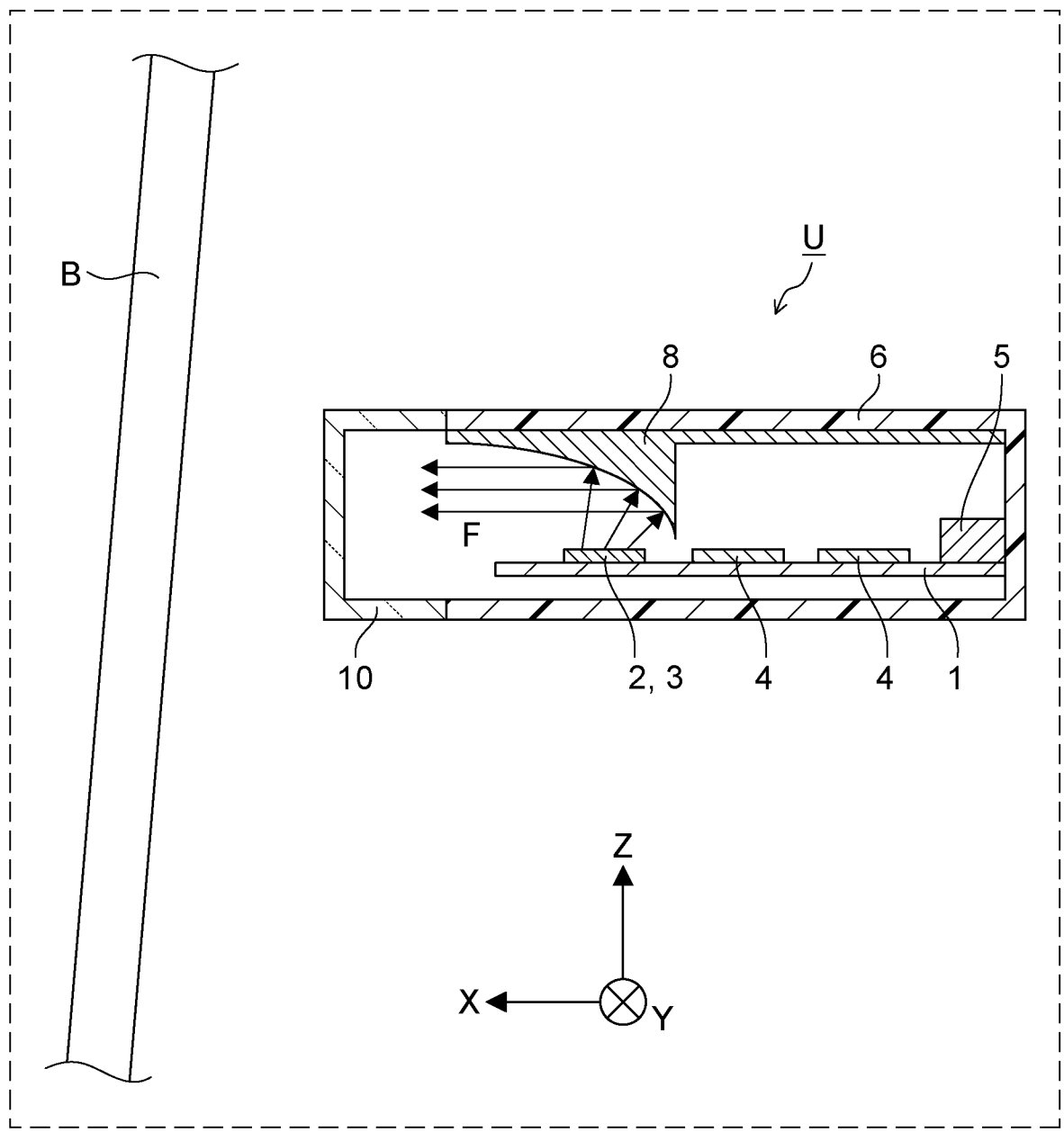
FIG. 12 is a side cross-sectional view of an antenna device according to a sixth embodiment.

FIG. 12 is a side cross-sectional view of the antenna device U according to the sixth embodiment. FIG. 13 is a perspective view of the reflector 8 of the antenna device U according to the sixth embodiment.

The antenna device U according to this embodiment is different from that of the antenna device U according to the fourth embodiment in the configuration of the reflector 8, and is different from the antenna device U according to the fourth embodiment in that the antenna device U according to this embodiment has no dielectric lens 7. Instead of the dielectric lens 7, the antenna device U according to this embodiment is provided with radome material 10 for protecting the transmitting antenna 2 and the receiving antenna 3.

In the reflector 8 according to this embodiment, the shape of the reflection surface in the vertical direction is a parabolic surface shape (also referred to as parabola shape) having a focal point at which the transmitting antenna 2 and the receiving antenna 3 are disposed (see FIG. 12).

With the above configuration, when reflecting the electromagnetic waves transmitted upward from the transmitting antenna 2, the reflector 8 can narrow the beam of that electromagnetic waves in the vertical direction. In addition, with the above configuration, when reflecting the electromagnetic waves from the front side toward the receiving antenna 3 side, the reflector 8 can collect the electromagnetic waves into the receiving antenna 3 side.

Figure 13:
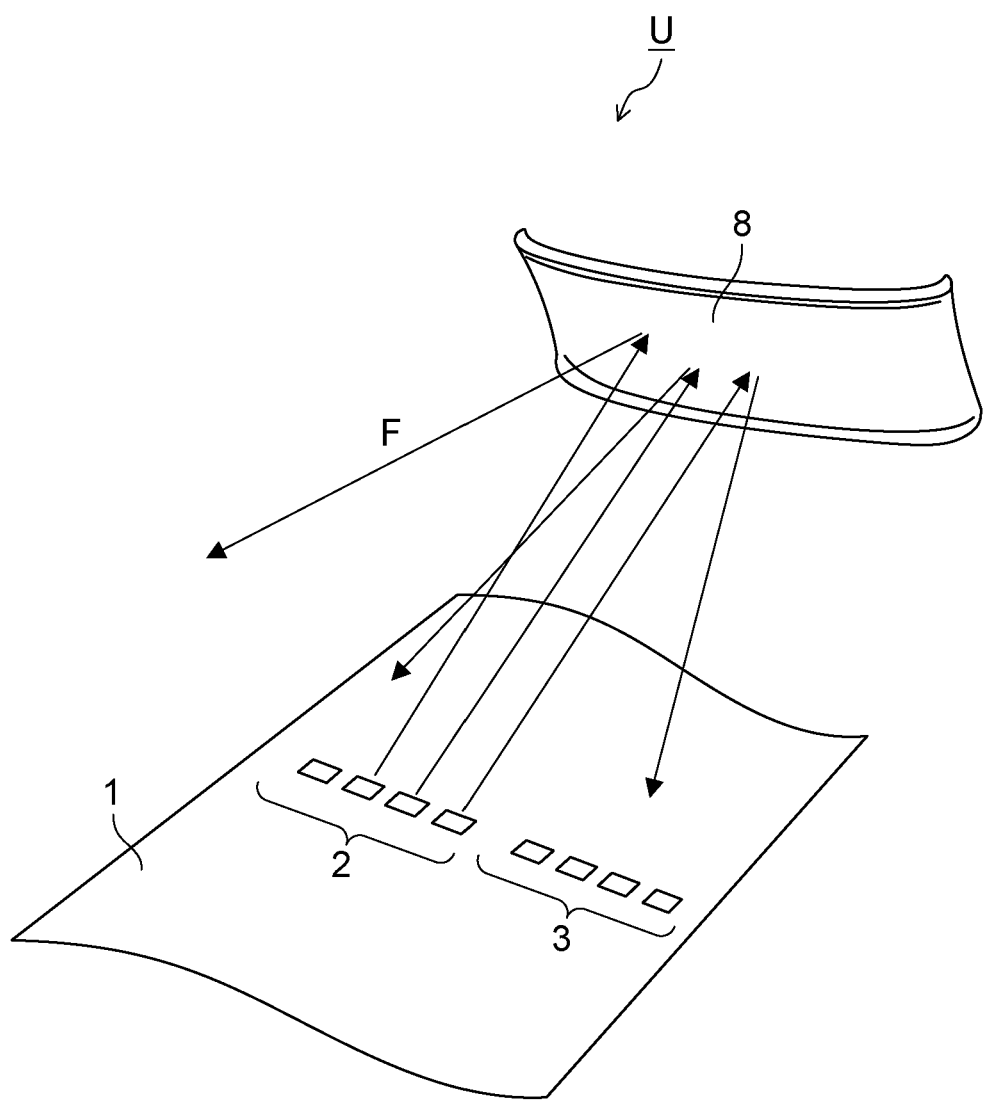
FIG. 13 is a perspective view of a reflector of the antenna device according to the sixth embodiment.

Meanwhile, the shape of the reflection surface of the reflector 8 in the horizontal direction is a shape warping in the outside direction from the right and left sides (±Y direction) relative to the position where the transmitting antenna 2 and the receiving antenna 3 are disposed (see FIG. 13). With the above configuration, when reflecting the electromagnetic waves transmitted upward from the transmitting antenna 2, the reflector 8 can spread the electromagnetic waves to the two sides.

In this embodiment, the multiple antenna elements of each of the transmitting antenna 2 and the receiving antenna 3 are, for example, disposed along the direction in which the reflection surface of the reflector 8 extends (±Y direction). This enables facilitation the azimuth estimation of the position of the target.

As described above, the antenna device U according to this embodiment can increase the gain in the vertical direction (±Z direction) when transmitting the electromagnetic waves while extending the target region of the object detection in the horizontal direction (±Y direction).

Seventh Embodiment

Figure 14:
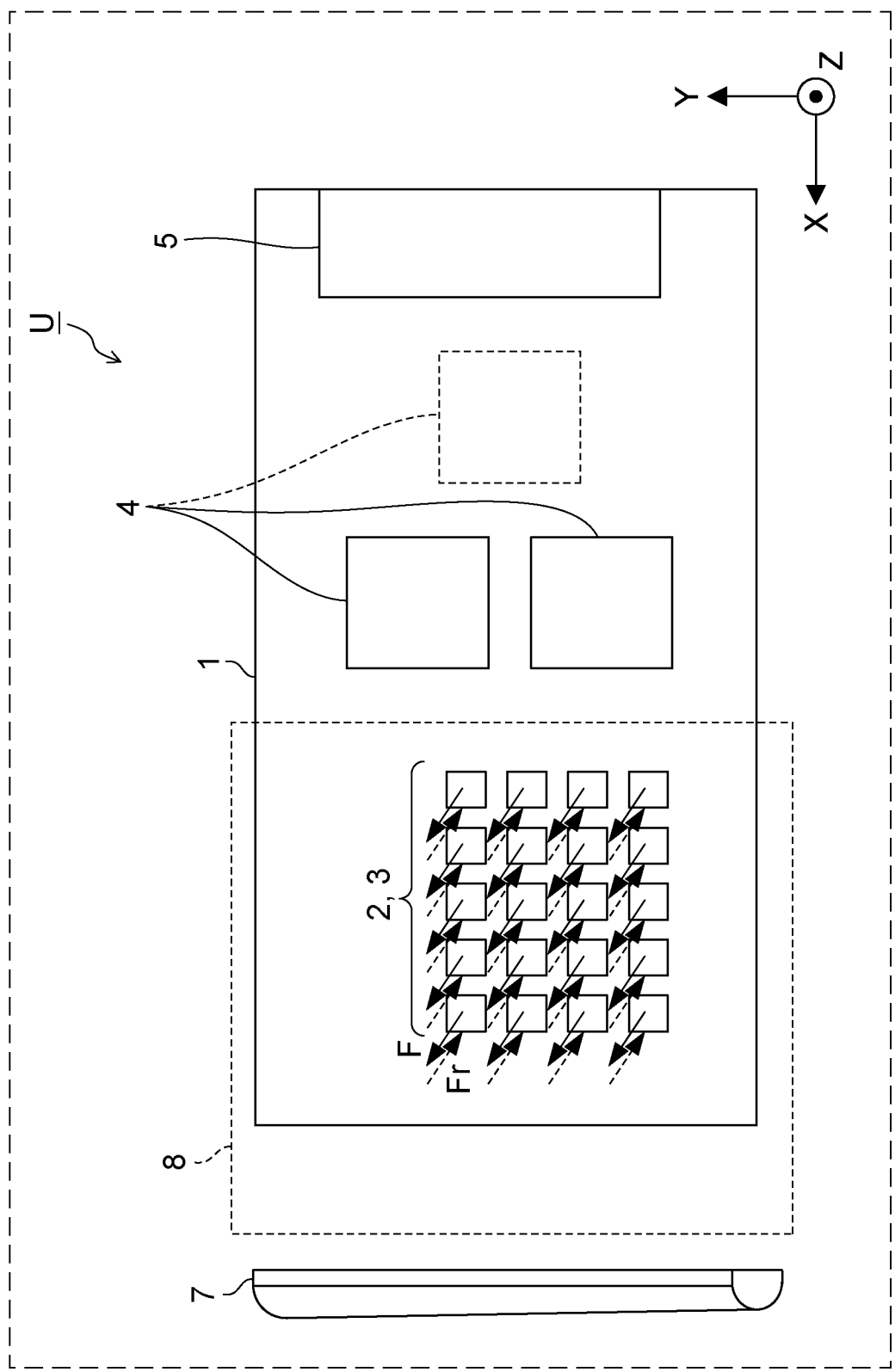
FIG. 14 is a plan view of an antenna device according to a seventh embodiment.

FIG. 14 is a plan view that illustrates an example of an antenna device U according to a seventh embodiment.

The antenna device U according to this embodiment is different from the antenna device U according to the first embodiment in that the transmitting antenna 2 and the receiving antenna 3 are composed of common antennae (here, 20 patch antennae).

In other words, the antenna device U according to this embodiment is controlled by the signal processing ICs 4 to execute the transmission operation of the electromagnetic waves and the reception operation of the electromagnetic waves in time-sharing on the antenna elements. Transfers of the electric signals between the antenna elements and the transmission circuit (signal processing IC 4 for transmission) and transfers of the electric signals between the antenna elements and the reception circuit (signal processing IC 4 for reception) are, for example, switched in time-sharing by a switch or circulator.

As described above, the antenna device U according to this embodiment can reduce the number of the antenna elements arranged in the Y direction. In this way, in the Y direction, since the size of the window of the housing 6 can be minimized, it is possible to further inhibit the reflected wave from the cover member B from entering the housing 6.

Eighth Embodiment

Next, an example of a configuration of an antenna device U according to an eighth embodiment is described with reference to FIGS. 15 and 16.

Figure 15:
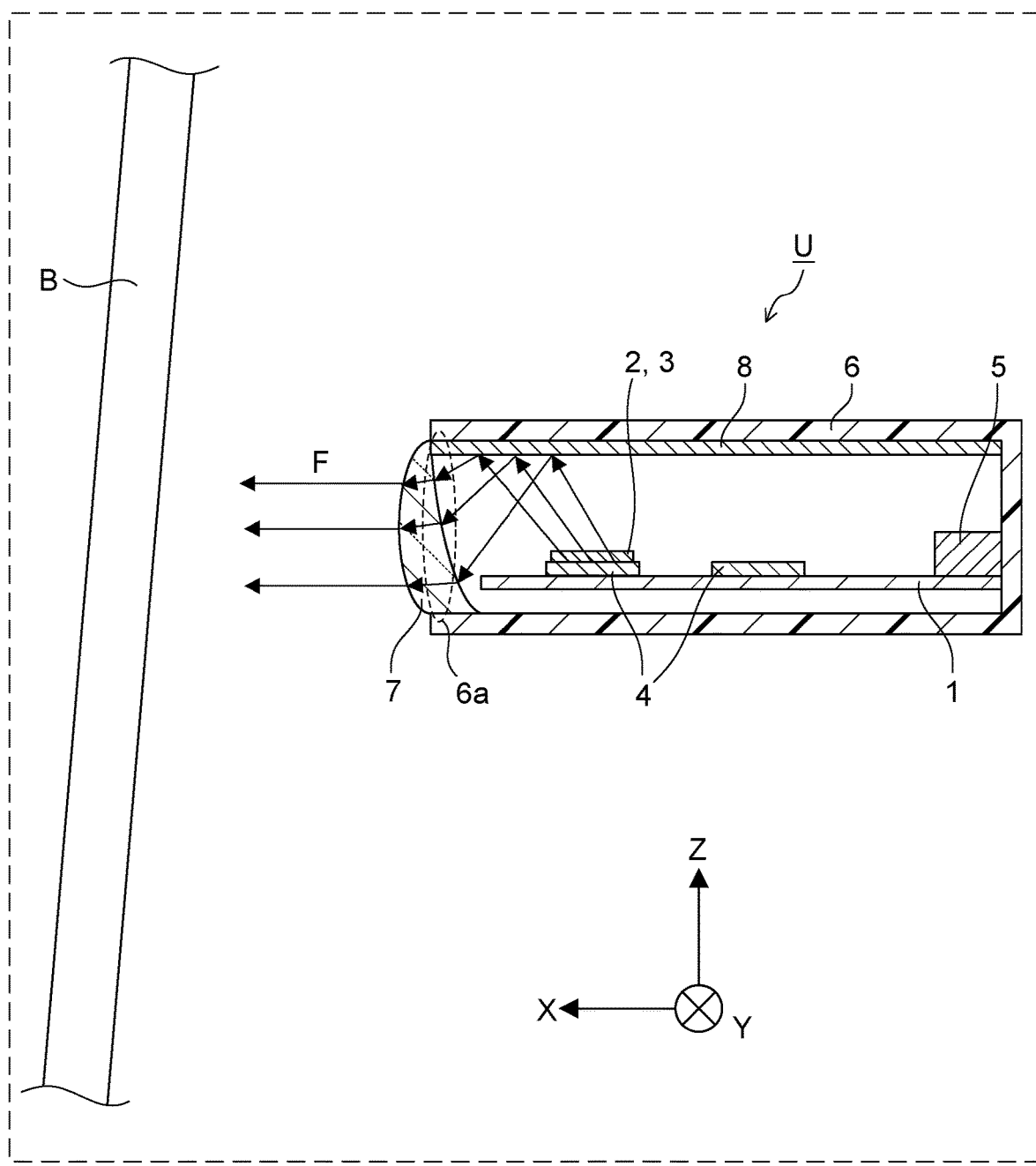
FIG. 15 is a side cross-sectional view of an antenna device according to an eighth embodiment.
Figure 16:
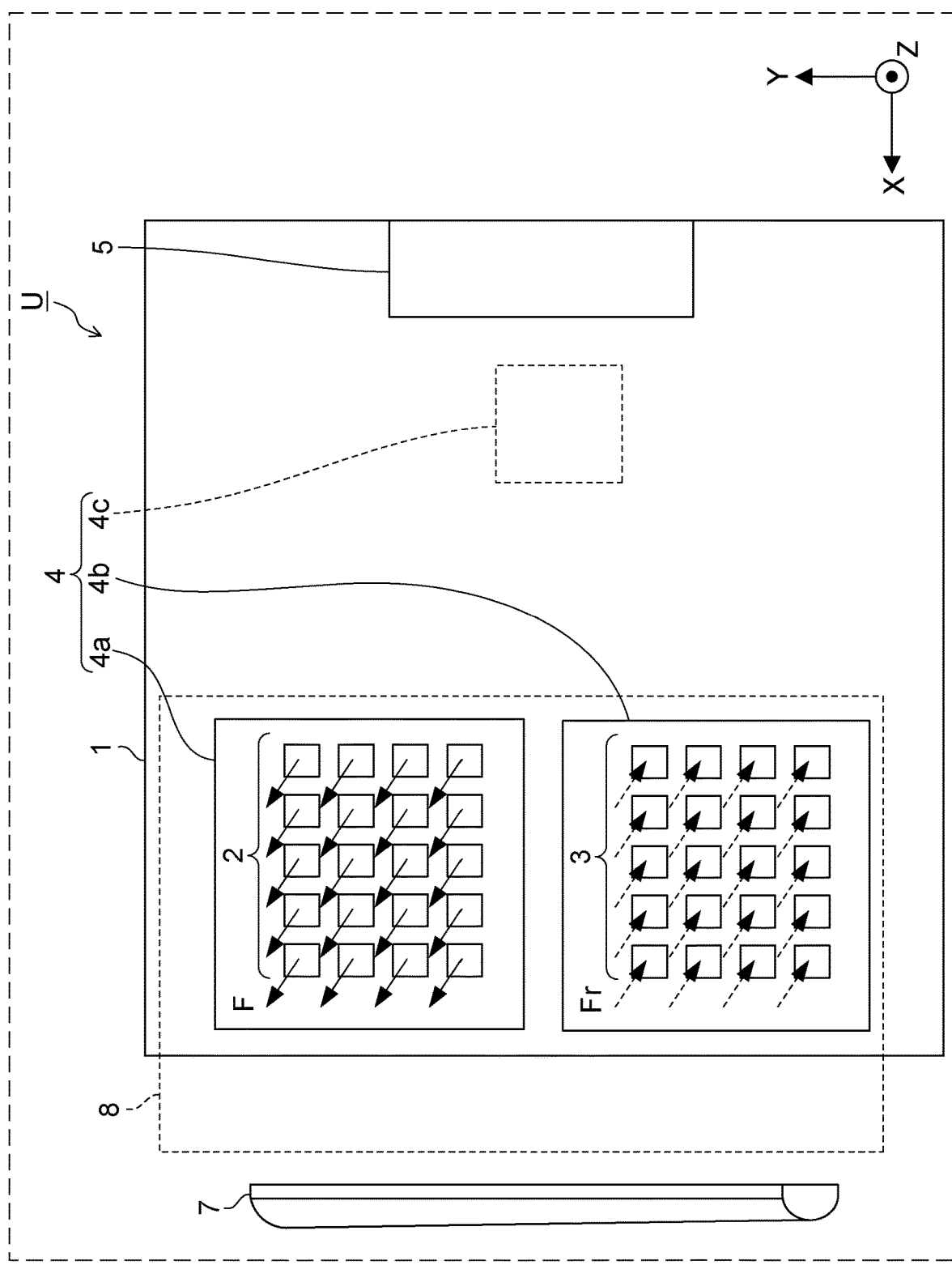
FIG. 16 is a plan view of the antenna device according to the eighth embodiment.

FIG. 15 is a side cross-sectional view of the antenna device U according to the eighth embodiment. FIG. 16 is a plan view of the antenna device U according to the eighth embodiment.

The antenna device U according to this embodiment is different from the antenna device U according to the first embodiment in that the transmitting antenna 2 and the receiving antenna 3 are integrally mounted with the signal processing ICs 4 respectively on the board surface of the circuit board 1.

The transmitting antenna 2 is, for example, mounted on the board surface of the circuit board 1 while being mounted in a package of a signal processing IC 4a that performs signal processing in relation to the transmission processing of the millimeter-wave band. The receiving antenna 3 is, for example, mounted on the board surface of the circuit board 1 while being mounted in a package of a signal processing IC 4b that performs signal processing in relation to the reception processing of the millimeter-wave band. A signal processing IC 4c in FIG. 16 is a signal processing IC that performs signal processing in relation to the baseband band.

As described above, the antenna device U according to this embodiment can reduce the distance between the transmitting antenna 2 or the receiving antenna 3 and the signal processing IC 4. This makes it possible to inhibit distortion of waveform of an analog signal in a wiring portion and contribute to improvement of S/N ratio. Also, it is possible to reduce electricity loss in the wiring portion.

Ninth Embodiment

In the above embodiments, an antenna device is used for describing an example of an application target of the antenna device U; however, the antenna device U according to the present disclosure can also be applied to communication use.

Figure 17:
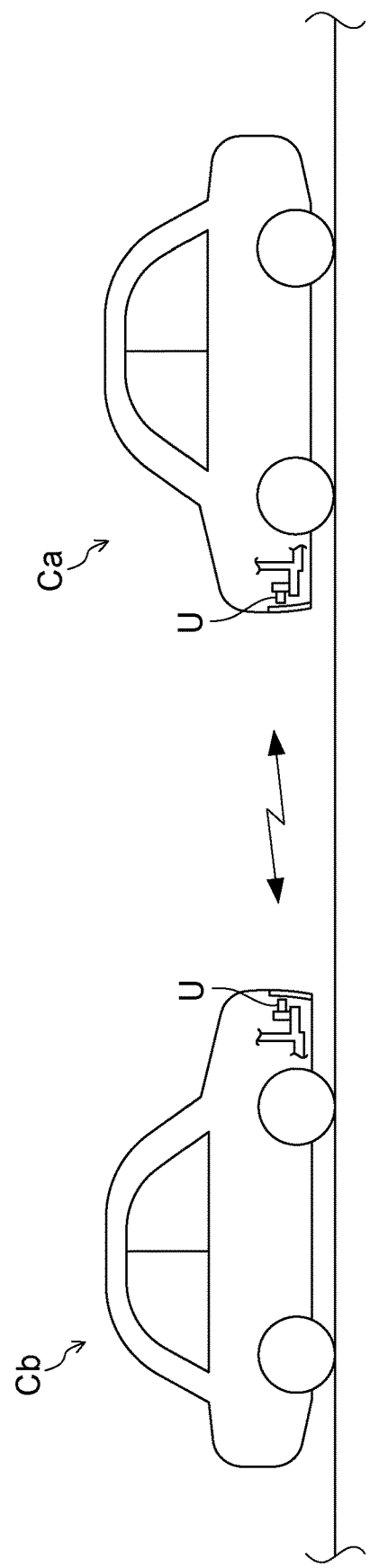
FIG. 17 is a diagram that illustrates an example of application of an antenna device according to a ninth embodiment to communication use.

FIG. 17 is a diagram that illustrates an example of application of an antenna device U according to a ninth embodiment to communication use.

FIG. 17 illustrates a situation where the antenna device U mounted in one vehicle Ca and the antenna device U mounted in the other vehicle Cb transmit and receive the electromagnetic waves therebetween and communicate to each other (i.e., vehicle-to-vehicle communications). The antenna device U according to this embodiment may be mounted with signal processing ICs for communications (not illustrated) instead of the above-described signal processing ICs 4 for object detection.

When applying the antenna device U to communication use like the antenna device U according to this embodiment, the shape of the reflection surface of the reflector 8 desirably is, as illustrated in FIG. 12, the parabolic surface shape (also referred to as parabola shape) in which the position where the transmitting antenna 2 and the receiving antenna 3 are disposed is the focal point. However, since it is for communications, the reflection surface desirably has a parabolic surface shape in every azimuth, which differs from the reflector 8 according to the sixth embodiment.

Since the antenna device U according to the present disclosure can effectively transmit the electromagnetic waves in a desirable direction even when transmitting the electromagnetic waves through the cover member B, it is possible to use the antenna device U according to the present disclosure for an aspect of communicating with another antenna device like this embodiment.

Other Embodiments

The present disclosure is not limited to the above-described embodiments and various modifications can be considered. For example, various combinations of the aspects described in those embodiments may be used.

In the above-described embodiments, the aspect where the extending direction of the board surface of the circuit board 1 and the extending direction of the cover member B are substantially orthogonal to each other is described as an example of the positional relationship between the circuit board 1 and the cover member B. However, the present disclosure can be applied to an aspect where the extending direction of the board surface of the circuit board 1 and the extending direction of the cover member B intersect at an arbitrary angle.

In the above-described embodiments, the aspect where the cover member B covers the antenna device U is described as an example of an aspect of applying the antenna device U. However, the antenna device U according to the present disclosure can be applied to an aspect where the cover member B does not cover the front region of the antenna device U.

In the above-described embodiments, the aspect of having the dielectric lens 7 is described as an example of the antenna device U. However, if there are no problems of gain of transmission and reception of the electromagnetic waves and shielding of the reflected wave arriving at the receiving antenna 3 from the cover member B, an aspect of having no dielectric lens 7 may be available.

Although specific examples of the present disclosure are described in detail, these are merely examples and do not intend to limit the scope of claims. The techniques described in the scope of claims include various modifications and changes of the specific examples described above.

The antenna device according to the present disclosure can be applied for transmitting and receiving electromagnetic waves through a cover member.

The present disclosure can be realized by software, hardware, or software in cooperation with hardware.

Each functional block used in the description of each embodiment described above can be partly or entirely realized by an LSI such as an integrated circuit, and each process described in the each embodiment may be controlled partly or entirely by the same LSI or a combination of LSIs. The LSI may be individually formed as chips, or one chip may be formed so as to include a part or all of the functional blocks. The LSI may include a data input and output coupled thereto. The LSI here may be referred to as an IC, a system LSI, a super LSI, or an ultra LSI depending on a difference in the degree of integration.

However, the technique of implementing an integrated circuit is not limited to the LSI and may be realized by using a dedicated circuit, a general-purpose processor, or a special-purpose processor. In addition, a FPGA (Field Programmable Gate Array) that can be programmed after the manufacture of the LSI or a reconfigurable processor in which the connections and the settings of circuit cells disposed inside the LSI can be reconfigured may be used. The present disclosure can be realized as digital processing or analogue processing.

If future integrated circuit technology replaces LSIs as a result of the advancement of semiconductor technology or other derivative technology, the functional blocks could be integrated using the future integrated circuit technology. Biotechnology can also be applied.

What is claimed is:

1. An antenna device that includes a housing formed with a window surface and configured to transmit and receive an electromagnetic wave through a cover member facing the window surface, the antenna device having a length in a direction of transmitting and receiving the electromagnetic wave that is greater than a height thereof, comprising:
    a circuit board that is provided inside the housing;
    a reflector that is provided inside the housing and faces a board surface of the circuit board;
    a transmitting antenna that is provided on the board surface and transmits the electromagnetic wave to a side of the reflector; and
    a receiving antenna that is provided on the board surface and receives the electromagnetic wave,
    wherein a reflection surface of the reflector has convex shape warping in an outside direction extending from right and left sides relative to a position where the transmitting antenna and the receiving antenna are disposed, and
    wherein the transmitting antenna and the receiving antenna respectively have a plurality of antenna elements disposed between the right and left sides where the reflector extends.

2. The antenna device according to claim 1, further comprising:
    a radome that covers a direction in which the electromagnetic wave is transmitted and received.

3. The antenna device according to claim 1, further comprising:
    a dielectric lens that is supported forward of the circuit board, narrows a beam of the electromagnetic wave from the reflector to emit the beam outside the antenna device, and collects the electromagnetic wave from outside the antenna device into the reflector.

4. The antenna device according to claim 3, wherein the dielectric lens converts the electromagnetic wave transmitted from the transmitting antenna to a plane wave.

5. The antenna device according to claim 4, wherein the dielectric lens is composed of a convex lens that has a convex shape in a front surface side.

6. The antenna device according to claim 1, wherein the transmitting antenna and the receiving antenna are each composed of a conductor pattern formed on the board surface of the circuit board.

7. The antenna device according to claim 6, wherein the transmitting antenna and the receiving antenna are patch antennae.

8. The antenna device according to claim 1, wherein the reflector reflects a beam of the electromagnetic wave transmitted from the transmitting antenna so as to narrow a beam width and reflects the electromagnetic wave from a front side such that the electromagnetic wave is collected.

9. The antenna device according to claim 8, wherein
in at least a vertical direction, the reflection surface of the reflector has a parabolic surface shape having a focal point at which the transmitting antenna and the receiving antenna are disposed.

10. The antenna device according to claim 1, further comprising:
the housing having a window on a front surface through which the electromagnetic wave passes and stores the circuit board so as to transmit and receive the electromagnetic wave through the window.

11. The antenna device according to claim 10, wherein the housing includes a metal.

12. The antenna device according to claim 10, wherein when a normal direction of the board surface of the circuit board is regarded as a vertical direction, a length in the vertical direction of the housing is shorter than a length in a front-rear direction of the housing.

13. The antenna device according to claim 10, wherein the housing has a connector that thermally bonds with the circuit board or a circuit part mounted on the circuit board.

14. The antenna device according to claim 10, further comprising:
a bracket that fixes the housing on the cover member arranged to cover a front region of outside the device and defines a direction in which the electromagnetic wave is transmitted outside the device.

15. The antenna device according to claim 14, wherein the bracket fixes the housing on the cover member so as to make the direction in which the electromagnetic wave is transmitted outside the device horizontal to a ground.

16. The antenna device according to claim 14, wherein the bracket is made of an electromagnetic wave absorber or material containing the electromagnetic wave absorber.

17. The antenna device according to claim 1, further comprising:
a signal processing unit that estimates an azimuth of a target based on a reflected wave from the target that is a part of the electromagnetic wave transmitted from the transmitting antenna.

18. The antenna device according to claim 17, wherein the signal processing unit and the transmitting antenna or the receiving antenna are integrally mounted on the board surface of the circuit board.

19. The antenna device according to claim 1, wherein the reflector is made of a metal member or a resin member with a surface coated with metal plating.

20. The antenna device according to claim 1 mounted in a vehicle.

* * * * *